US007868267B2

(12) United States Patent
Tanaka

(10) Patent No.: US 7,868,267 B2
(45) Date of Patent: Jan. 11, 2011

(54) LASER IRRADIATING DEVICE, LASER IRRADIATING METHOD AND MANUFACTURING METHOD OF SEMICONDUCTOR DEVICE

(75) Inventor: Koichiro Tanaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/207,769

(22) Filed: Jul. 31, 2002

(65) Prior Publication Data

US 2003/0024905 A1 Feb. 6, 2003

(30) Foreign Application Priority Data

Aug. 3, 2001 (JP) .............................. 2001-237097

(51) Int. Cl.
*B23K 26/00* (2006.01)
(52) U.S. Cl. .............................. 219/121.6; 219/121.76; 219/121.82
(58) Field of Classification Search .............. 219/121.6, 219/121.73, 121.76, 121.78, 121.82, 121.85; 438/166
See application file for complete search history.

(56) References Cited

U.S. PATENT DOCUMENTS

| | | | | |
|---|---|---|---|---|
| 3,900,737 A | * | 8/1975 | Collier et al. | ............. 250/492.2 |
| 3,992,682 A | | 11/1976 | White et al. | |
| 4,131,487 A | * | 12/1978 | Pearce et al. | ................. 438/473 |
| 4,249,960 A | * | 2/1981 | Schnable et al. | .......... 219/121.6 |
| 4,327,972 A | | 5/1982 | Brunsting | |

(Continued)

FOREIGN PATENT DOCUMENTS

CN       1284741       2/2001

(Continued)

OTHER PUBLICATIONS

Ishihara et al., "Location-Controlled Adjacent Grains Following Excimer-Laser Melting of Si Thin-Films," AM-LCD '98, pp. 153-156.

(Continued)

*Primary Examiner*—M. Alexandra Elve
(74) *Attorney, Agent, or Firm*—Eric J. Robinson; Robinson Intellectual Property Law Office, P.C.

(57) ABSTRACT

An object of the present invention is to provide a method and a device for constantly setting the energy distribution of a laser beam on an irradiating face, and uniformly irradiating the laser beam to the entire irradiating face. Further, another object of the present invention is to provide a manufacturing method of a semiconductor device including this laser irradiating method in a process. Therefore, the present invention is characterized in that the shapes of plural laser beams on the irradiating face are formed by an optical system in an elliptical shape or a rectangular shape, and the plural laser beams are irradiated while the irradiating face is moved in a first direction, and the plural laser beams are irradiated while the irradiating face is moved in a second direction and is moved in a direction reverse to the first direction. The plural laser beams may be irradiated while the irradiating face is moved in the first direction, and the plural laser beams may be irradiated while the irradiating face is moved in the direction reverse to the first direction, and the irradiating face may be also moved in the second direction.

24 Claims, 21 Drawing Sheets

U.S. PATENT DOCUMENTS

| | | | |
|---|---|---|---|
| 4,330,363 A | 5/1982 | Biegesen et al. | |
| 4,370,175 A | 1/1983 | Levatter | |
| 4,410,237 A | 10/1983 | Veldkamp | |
| 4,415,794 A * | 11/1983 | Delfino et al. | 219/121.85 |
| 4,432,648 A | 2/1984 | Musto et al. | |
| 4,734,550 A * | 3/1988 | Imamura et al. | 219/121.77 |
| 4,779,943 A | 10/1988 | Tatsuno et al. | |
| 4,908,493 A | 3/1990 | Susemihl | |
| 5,208,187 A * | 5/1993 | Tsubouchi et al. | 438/607 |
| 5,302,798 A * | 4/1994 | Inagawa et al. | 219/121.7 |
| 5,304,357 A | 4/1994 | Sato et al. | |
| 5,372,836 A | 12/1994 | Imahashi et al. | |
| 5,405,804 A | 4/1995 | Yabe | |
| 5,438,441 A | 8/1995 | Rockstroh et al. | |
| 5,521,107 A | 5/1996 | Yamazaki et al. | |
| 5,604,635 A | 2/1997 | Lawandy | |
| 5,643,826 A | 7/1997 | Ohtani et al. | |
| 5,669,979 A | 9/1997 | Elliott et al. | |
| 5,708,252 A | 1/1998 | Shinohara et al. | |
| 5,754,328 A | 5/1998 | Cobb et al. | |
| 5,814,156 A | 9/1998 | Elliott et al. | |
| 5,828,481 A | 10/1998 | Cobb et al. | |
| 5,854,803 A | 12/1998 | Yamazaki et al. | |
| 5,888,839 A | 3/1999 | Ino et al. | |
| 5,893,730 A * | 4/1999 | Yamazaki et al. | 438/166 |
| 5,893,990 A | 4/1999 | Tanaka | |
| 5,923,962 A | 7/1999 | Ohtani et al. | |
| 5,932,118 A | 8/1999 | Yamamoto et al. | |
| 5,953,597 A | 9/1999 | Kusumoto et al. | |
| 5,986,807 A | 11/1999 | Fork | |
| 6,011,275 A | 1/2000 | Ohtani et al. | |
| 6,013,928 A | 1/2000 | Yamazaki et al. | |
| 6,038,075 A | 3/2000 | Yamazaki et al. | |
| 6,071,765 A | 6/2000 | Noguchi et al. | |
| 6,104,741 A | 8/2000 | Igarashi et al. | |
| 6,136,632 A | 10/2000 | Higashi | |
| 6,137,633 A | 10/2000 | Tanaka | |
| 6,156,997 A * | 12/2000 | Yamazaki et al. | 219/121.8 |
| 6,159,777 A | 12/2000 | Takenouchi et al. | |
| 6,160,827 A | 12/2000 | Tanaka | |
| 6,172,330 B1 | 1/2001 | Yamamoto et al. | |
| 6,204,099 B1 | 3/2001 | Kusumoto et al. | |
| 6,210,996 B1 | 4/2001 | Yamazaki et al. | |
| 6,229,115 B1 | 5/2001 | Voss et al. | |
| 6,242,291 B1 | 6/2001 | Kusumoto et al. | |
| 6,242,292 B1 | 6/2001 | Yamazaki et al. | |
| 6,248,606 B1 | 6/2001 | Ino et al. | |
| 6,249,385 B1 | 6/2001 | Yamazaki et al. | |
| 6,261,856 B1 | 7/2001 | Shinohara et al. | |
| 6,265,745 B1 | 7/2001 | Kusumoto et al. | |
| 6,281,470 B1 * | 8/2001 | Adachi | 219/121.62 |
| 6,285,042 B1 | 9/2001 | Ohtani et al. | |
| 6,291,320 B1 | 9/2001 | Yamazaki et al. | |
| 6,313,434 B1 * | 11/2001 | Patterson et al. | 219/121.69 |
| 6,335,509 B1 * | 1/2002 | Jung | 219/121.77 |
| 6,335,541 B1 | 1/2002 | Ohtani et al. | |
| 6,353,203 B1 | 3/2002 | Hokodate et al. | |
| 6,410,373 B1 | 6/2002 | Chang et al. | |
| 6,440,785 B1 | 8/2002 | Yamazaki et al. | |
| 6,441,965 B2 | 8/2002 | Yamazaki et al. | |
| 6,472,295 B1 | 10/2002 | Morris et al. | |
| 6,521,473 B1 * | 2/2003 | Jung | 438/30 |
| 6,528,397 B1 | 3/2003 | Taketomi et al. | |
| 6,534,744 B1 | 3/2003 | Yamazaki et al. | |
| 6,535,535 B1 * | 3/2003 | Yamazaki et al. | 372/43 |
| 6,556,711 B2 | 4/2003 | Koga et al. | |
| 6,563,843 B1 * | 5/2003 | Tanaka | 372/9 |
| 6,573,161 B1 | 6/2003 | Miyasaka et al. | |
| 6,602,744 B1 | 8/2003 | Ino et al. | |
| 6,635,849 B1 | 10/2003 | Okawa et al. | |
| 6,638,800 B1 | 10/2003 | Ishihara et al. | |
| 6,660,609 B2 * | 12/2003 | Tanaka et al. | 438/378 |
| 6,675,057 B2 * | 1/2004 | Liu | 700/117 |
| 6,693,257 B1 | 2/2004 | Tanaka | |
| 6,730,550 B1 | 5/2004 | Yamazaki et al. | |
| 6,750,423 B2 | 6/2004 | Tanaka et al. | |
| 6,753,212 B2 | 6/2004 | Yamazaki et al. | |
| 6,770,546 B2 | 8/2004 | Yamazaki | |
| 6,791,060 B2 | 9/2004 | Dunsky et al. | |
| 6,806,099 B2 | 10/2004 | Takeda et al. | |
| 6,809,012 B2 | 10/2004 | Yamazaki et al. | |
| 6,844,523 B2 | 1/2005 | Yamazaki et al. | |
| 6,849,482 B2 | 2/2005 | Yamazaki et al. | |
| 6,861,614 B1 | 3/2005 | Tanabe et al. | |
| 6,944,195 B2 | 9/2005 | Yamazaki et al. | |
| 6,961,184 B2 | 11/2005 | Yamazaki et al. | |
| 6,961,361 B2 | 11/2005 | Tanaka | |
| 6,974,731 B2 | 12/2005 | Yamazaki et al. | |
| 7,015,422 B2 | 3/2006 | Timans | |
| 7,095,762 B2 | 8/2006 | Yamazaki et al. | |
| 7,135,390 B2 | 11/2006 | Tanaka | |
| 7,138,306 B2 | 11/2006 | Tanaka et al. | |
| 7,160,764 B2 | 1/2007 | Tanaka | |
| 7,179,698 B2 | 2/2007 | Yamazaki et al. | |
| 7,279,721 B2 | 10/2007 | Jennings et al. | |
| 7,362,784 B2 | 4/2008 | Yamazaki et al. | |
| 7,375,010 B2 | 5/2008 | Tanaka | |
| 7,473,622 B2 | 1/2009 | Yamazaki et al. | |
| 2001/0010702 A1 | 8/2001 | Tanaka | |
| 2001/0036755 A1 | 11/2001 | Tanaka | |
| 2002/0094008 A1 | 7/2002 | Tanaka | |
| 2002/0137311 A1 | 9/2002 | Timans | |
| 2002/0151121 A1 | 10/2002 | Tanaka | |
| 2003/0021307 A1 | 1/2003 | Yamazaki | |
| 2003/0024905 A1 | 2/2003 | Tanaka | |
| 2003/0035129 A1 | 2/2003 | Phillips et al. | |
| 2003/0035219 A1 | 2/2003 | Tanaka | |
| 2003/0038122 A1 | 2/2003 | Yamazaki et al. | |
| 2003/0038123 A1 | 2/2003 | Dykes et al. | |
| 2003/0059990 A1 | 3/2003 | Yamazaki | |
| 2003/0080099 A1 | 5/2003 | Tanaka et al. | |
| 2003/0080100 A1 | 5/2003 | Yamazaki et al. | |
| 2003/0086182 A1 | 5/2003 | Tanaka et al. | |
| 2003/0089690 A1 | 5/2003 | Yamazaki et al. | |
| 2003/0132205 A1 | 7/2003 | Yamazaki et al. | |
| 2003/0143337 A1 | 7/2003 | Tanaka | |
| 2003/0203549 A1 | 10/2003 | Yamazaki et al. | |
| 2004/0069751 A1 | 4/2004 | Yamazaki et al. | |
| 2004/0084427 A1 | 5/2004 | Talwar et al. | |
| 2005/0092937 A1 | 5/2005 | Tanaka | |
| 2006/0166470 A1 | 7/2006 | Tanaka | |
| 2006/0215721 A1 | 9/2006 | Tanaka et al. | |
| 2006/0215722 A1 | 9/2006 | Tanaka et al. | |
| 2007/0000428 A1 | 1/2007 | Yamazaki et al. | |
| 2007/0004110 A1 | 1/2007 | Tanaka | |
| 2007/0099401 A1 | 5/2007 | Tanaka | |
| 2007/0254392 A1 | 11/2007 | Tanaka | |
| 2008/0254598 A1 | 10/2008 | Yamazaki et al. | |

FOREIGN PATENT DOCUMENTS

| | | |
|---|---|---|
| EP | 1 055 479 | 11/2000 |
| EP | 1076359 A | 2/2001 |
| EP | 1 083 590 | 3/2001 |
| EP | 1 162 023 | 12/2001 |
| JP | 60-189216 A | 9/1985 |
| JP | 62-104117 | 5/1987 |
| JP | 63-138991 | 9/1988 |
| JP | 01-173707 | 7/1989 |
| JP | 01-239837 | 9/1989 |
| JP | 02-051224 | 2/1990 |
| JP | 02-181419 | 7/1990 |
| JP | 02-308423 | 12/1990 |
| JP | 03-210990 | 9/1991 |

| | | |
|---|---|---|
| JP | 03-289128 | 12/1991 |
| JP | 05-102062 | 4/1993 |
| JP | 05-226790 | 9/1993 |
| JP | 06-067119 A | 3/1994 |
| JP | 06-140323 | 5/1994 |
| JP | 07-183540 | 7/1995 |
| JP | 08-195357 | 7/1996 |
| JP | 09-043541 | 2/1997 |
| JP | 09-102468 | 4/1997 |
| JP | 09-180997 A | 7/1997 |
| JP | 09-260302 | 10/1997 |
| JP | 09-281085 | 10/1997 |
| JP | 10-197709 | 7/1998 |
| JP | 10-223554 | 8/1998 |
| JP | 10-325941 | 12/1998 |
| JP | 2000-076678 | 3/2000 |
| JP | 2000-269161 | 9/2000 |
| JP | 2000-306834 | 11/2000 |
| JP | 2001-127003 A | 5/2001 |
| JP | 2001-156017 | 6/2001 |
| JP | 2001-156018 | 6/2001 |
| JP | 2001-250790 | 9/2001 |
| JP | 2002-139697 | 5/2002 |
| JP | 2002-141300 | 5/2002 |
| KR | 2000-0024851 A | 5/2000 |

OTHER PUBLICATIONS

Crowder et al., "Low Temperature Single-Crystal Si TFT's Fabricated on Si Films Processed via Sequential Lateral Solidification," IEEE Electron Device Letters, vol. 19, No. 8, pp. 306-308.

Hara et al., "Ultra-high Performance Poly-Si TFTs on a Glass by a Stable Scanning CW Laser Lateral Crystallization," AM-LCD '01, pp. 227-230.

Takeuchi et al., "Performance of poly-Si TFTs Fabricated by a Stable Scanning CW Laser Crystallization," AM-LCD '01, pp. 251-254.

Specification, Drawings, Claims and Abstract of U.S. Appl. No. 09/635,422 entitled Laser Apparatus, Laser Annealing Method, and Manufacturing Method of a Semiconductor Device, filed Aug. 10, 2000.

Specification, Drawings, Claims and Abstract of U.S. Appl. No. 10/021,719 entitled Laser Annealing Method and Semiconductor Device Fabricating Method, filed Dec. 19, 2001.

Search Report in counterpart Singapore Application No. 200204609-2 and Written Opinion dated Apr. 27, 2004, 12 pages, Eng.

I. Indutnyi et al., *Holographic Optical Element Fabrication Using Chalcogenide Layers*, Optical Engineering, vol. 34, No. 4, Apr. 1, 1995, pp. 1030-1038.

Search Report (Application No. 200500528-5) dated Jun. 13, 2008.

Office Action (Application No. 200810092402.3) Dated May 8, 2009, Full.

Korean Office Action (Application No. 2009-0048900;KR05885D1) Dated Jun. 17, 2010, Full.

* cited by examiner

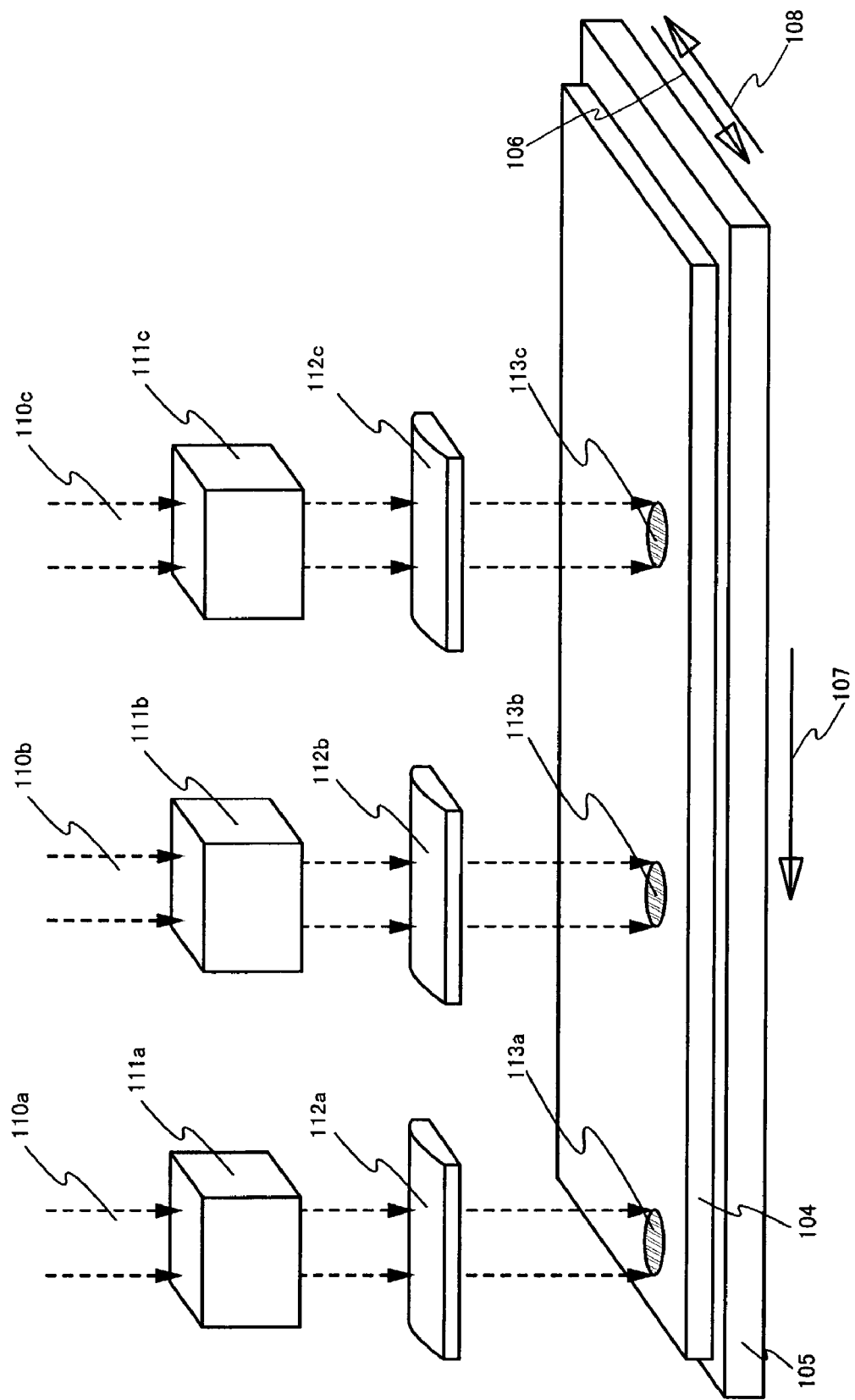

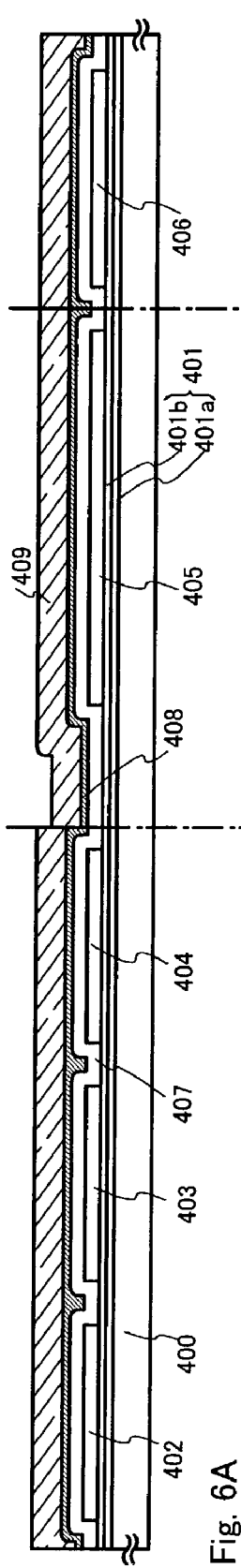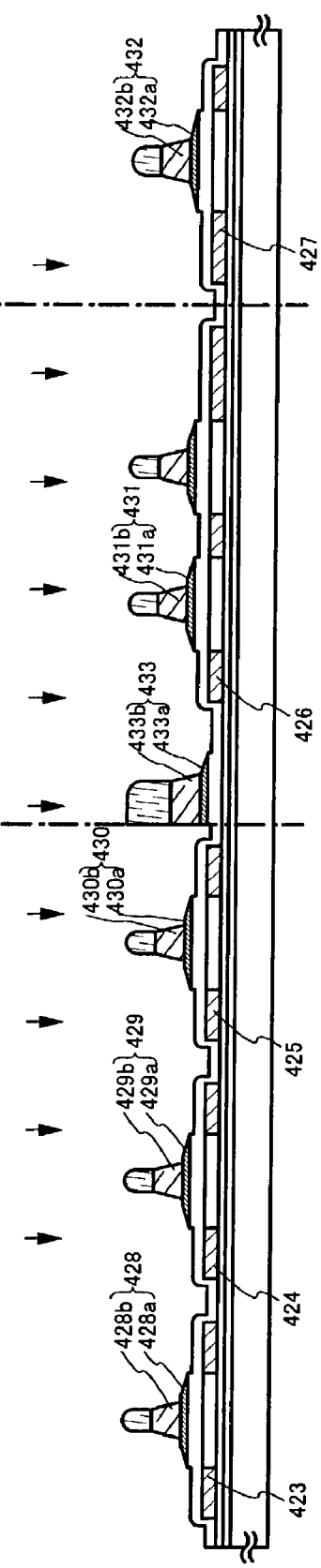
Fig. 6A
Fig. 6B
Fig. 6C

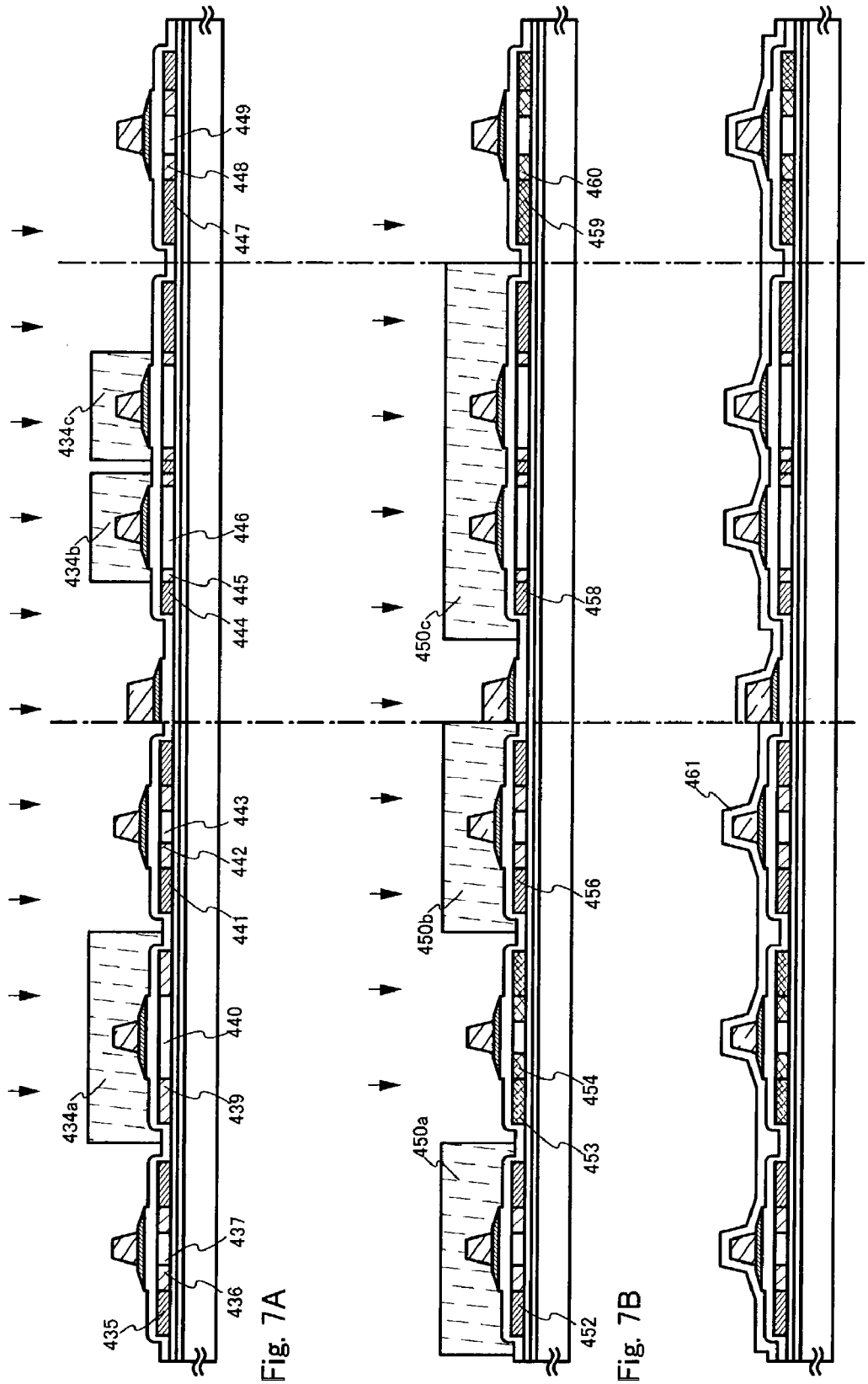

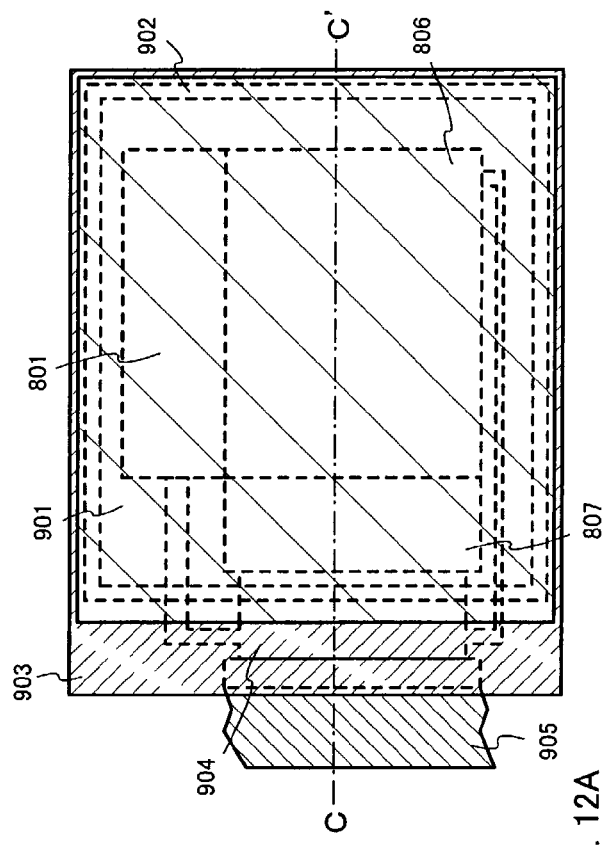
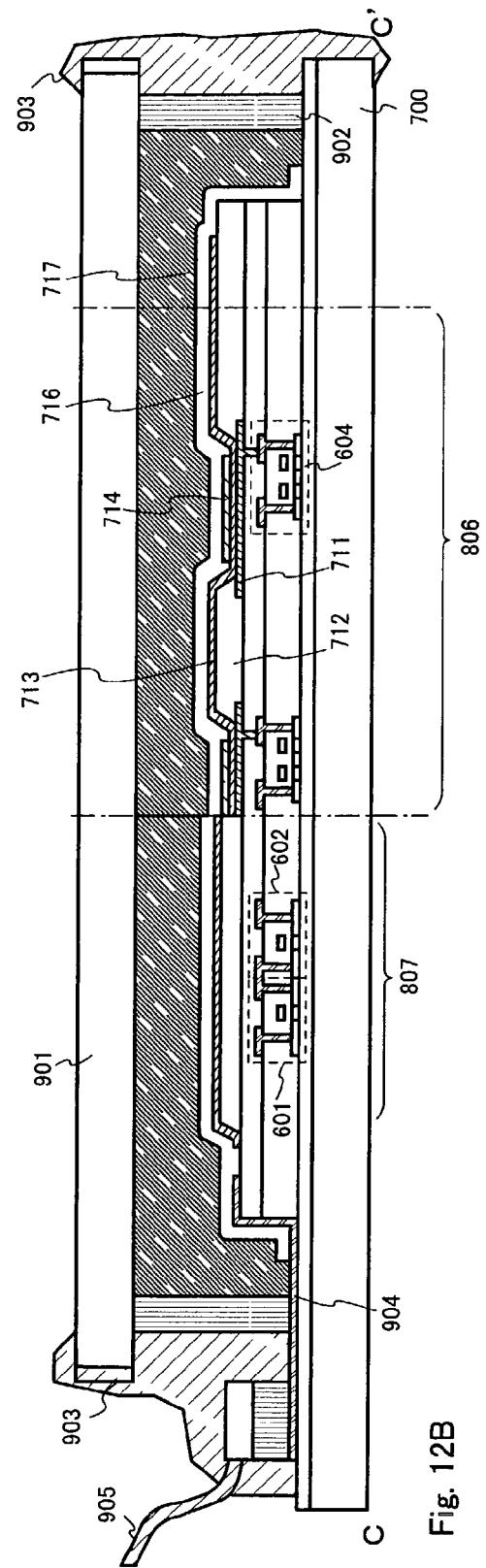
Fig. 12A
Fig. 12B

LASER IRRADIATING DEVICE, LASER IRRADIATING METHOD AND MANUFACTURING METHOD OF SEMICONDUCTOR DEVICE

BACKGROUND OF THE INVENTION

The present invention relates to a laser irradiation method of annealing a semiconductor film using a laser beam and a laser irradiation apparatus for performing the laser annealing (apparatus including a laser and an optical system for guiding a laser beam output from the laser to a member to be processed). Further, the present invention relates to a semiconductor device manufactured by the steps including the laser annealing step and a method of manufacturing the semiconductor device. Note that the semiconductor device mentioned through the specification includes an electro-optical device such as a liquid crystal display device or a light emitting device and an electronic device including the electro-optical device as its component.

DESCRIPTION OF THE RELATED ART

In recent years, a wide range of researches have been made as to the art of applying laser annealing to a semiconductor film formed on an insulating substrate such as a glass substrate to crystallize the semiconductor film or to improve the crystallinity thereof. Silicon is widely used for such a semiconductor film. In the present specification, means for crystallizing a semiconductor film by a laser beam to obtain a crystalline semiconductor film is referred to as laser crystallization.

As compared with synthetic quartz glass substrates which have heretofore widely been used, glass substrates have the advantages of being inexpensive and rich in workability and of facilitating fabrication of large-area substrates. This is the reason why a wide range of researches have been made. The reason why lasers are preferentially used for crystallization is that the melting points of glass substrates are low. Lasers can give high energy to semiconductor films without increasing the temperatures of substrates to a great extent. In addition, lasers are remarkably high in throughput compared to heating means using electric heating furnaces.

A crystalline semiconductor is made of multiple crystal grains, and is also called a polycrystalline semiconductor film. Since a crystalline semiconductor film formed by the application of laser annealing has high mobility, the crystalline silicon film is used to form thin film transistors (TFTs). For instance, the thin film transistors are widely used in an active matrix type liquid crystal display device in which TFTs for pixel driving and TFTs for driving circuits are fabricated on one glass substrate.

However, the crystalline semiconductor film manufactured by the laser annealing method is formed from a plurality of crystal grains, and the position and the size of the crystal grains are random. The TFT manufactured on the glass substrate is formed by separating the crystalline semiconductor film with island-like patterning in order to realize element isolation. In this case, the crystalline semiconductor film can not be formed with the designation of the position and the size of the crystal grains. There exist numerous recombination centers and trapping centers which derive from an amorphous structure, a crystal defect or the like exist in an interface of the crystal grain (crystal grain boundary) compared with the inside of the crystal grain. It is known that when a carrier is trapped in the trapping center, the potential of the crystal grain boundary rises, which becomes a barrier to the carrier, whereby the current transporting property of the carrier is lowered. The crystallinity of the semiconductor film in a channel forming region has a great effect on the characteristic of the TFT. However, it is hardly possible that the channel forming region is formed of a single crystal semiconductor film without influence of the crystal grain boundary.

In order to form the channel forming region by the single crystal semiconductor film without influence of the crystal grain boundary, various attempts for forming the position-controlled crystal grain of large grain size are made in the laser annealing method. First, a solidifying process of the semiconductor film that has been subjected to irradiation of a laser beam is explained.

It takes time in a degree until solid phase nucleation occurs in a liquid semiconductor film that has been completely melted by laser beam irradiation. Numberless and uniform (or nonuniform) nucleations occur and grow in a completely melted region, whereby the solidifying process of the liquid semiconductor film is completed. Obtained in this case are crystal grains which are random in position and size.

Further, in the case where the semiconductor film is not completely melted by the laser beam irradiation and solid phase semiconductor regions remain partially, crystal growth begins at the solid phase semiconductor regions immediately after the laser beam irradiation. As described above, it takes time in a degree until the nucleation occurs in the completely melted region. Thus, a solid-liquid interface, which is the tip of the crystal growth, moves in a horizontal direction to the surface of the semiconductor film (hereinafter referred to as lateral direction) until the nucleation to occurs in the completely melted region, whereby the crystal grain grows several tens of times as long as the film thickness. This growth ends with the occurrence of numberless and uniform (or nonuniform) nucleations in the completely melted region. Hereinafter, this phenomenon is referred to as a super lateral growth.

In an amorphous semiconductor film or a polycrystalline semiconductor film as well, an energy region of a laser beam where the super lateral growth is realized, exists. However, the above-mentioned energy region is very narrow, and the position where a large crystal grain is obtained can not be controlled. Further, the regions except for the region of the large crystal grain are microcrystalline regions where numerous nucleations occur or amorphous regions.

As described above, if a temperature gradient in the lateral direction can be controlled (a heat flow is made to occur in the lateral direction) in the laser beam energy region in which the semiconductor film is completely melted, the growth position and the growth direction of the crystal grain can be controlled. Various attempts are carried out in order to realize this method.

For example, Ishihara, R., and Burtsev, A., (AM-LCD '98, pp. 153-156, 1998) reported on a laser annealing method in which they formed a high melting point metallic film between a substrate and a base silicon oxide film, and formed an amorphous silicon film above the high melting point metallic film, and then irradiated an excimer laser beam from both the top surface side of the substrate (defined in this specification as the face upon which the film is formed) and from the bottom surface side of the substrate (defined in this specification as the face on the opposite side as the face upon which the film is formed). The laser beam which is irradiated from the top surface of the substrate is absorbed by the silicon film and its energy is converted into heat. On the other hand, the laser beam which is irradiated from the bottom surface is absorbed by the high melting point metallic film and its energy is converted to heat; the high melting point metallic film is heated to a high temperature. The silicon oxide film between the heated high melting point metallic film and the silicon film works as a heat accumulation layer, and therefore the cooling speed of the melted silicon film can be slowed. It is reported that crystal grains having a maximum diameter of 6.4 μm can be in arbitrary locations by forming the high melting point metallic film in the arbitrary locations.

James S. Im, et al., of Columbia University showed a sequential lateral solidification method (hereafter referred to as SLS method) in which super lateral growth can be achieved in arbitrary locations. The SLS method is one in which crystallization is performed by moving a slit shaped mask over a distance on the order of which super lateral growth takes place (approximately 0.75 μm) every shot.

In the other hand, the use of large-area substrate is advanced increasingly. The reason is why a semiconductor device such as a plurality of liquid crystal display device panels is fabricated by using a large-area substrate is that high throughput is obtained and the reduction of the cost can be realized. For instance, a substrate of 600 mm×720 mm, a substrate of 320 mm×400 mm, a circular substrate of 12 inches (approximately 300 nm in diameter) or the like are used as the large-areas substrate. In addition, it is thought that a substrate of 1 m×1 m or more is be used in the future.

For example, there is a method for irradiating a laser beam by using a galvano mirror with respect to a large area substrate. Its situation will be explained by using FIG. 5.

The laser beam 201 reaches a substrate 204 via a galvano mirror 202 and an fθ lens 203. The angle of the galvano mirror is changed in time by vibrating the galvano mirror 202 so that the position of the laser beam on the substrate is moved in the direction of an arrow shown by reference numeral 206. When the galvano mirror is vibrated in a half period, the laser beam is adjusted such that the laser beam is moved from end to end of the width of the substrate. At this time, even when the position of the laser beam on the substrate is moved, the fθ lens 203 is adjusted such that energy density of the laser beam is constant at any time on the substrate.

When the galvano mirror is vibrated in the half period, the laser beam is moved from end to end of the width of the substrate. Thus, an irradiated portion of the laser beam is laser-annealed. The speed of the vibration of the galvano mirror is adjusted such that no irradiating area of the laser beam is intermittent. Thereafter, a stage is moved in a direction perpendicular to the direction of the arrow shown by reference numeral 206, and the laser beam begins to be again moved on the substrate in the direction shown by reference numeral 206. The laser beam can be irradiated on an entire substrate face by repeating these operations. Namely, the laser beam is irradiated to the entire substrate face by repeating the movement of an irradiating position and the movement of the stage using rotation of the galvano mirror.

However, as the angle of the galvano mirror is changed, the incident angle of the laser beam to the substrate is changed as shown by reference numerals α, β and γ in FIG. 5. When the laser beam is particularly irradiated to the large area substrate, the change in the incident angle becomes notable. The change in the incident angle of the laser beam to the irradiating face means that the energy distribution of the above laser beam on the irradiating face is changed. In FIG. 16, the laser beam of 532 nm in wavelength is transmitted through the substrate of 700 μm in thickness and 1.5 in refractive index, and reflectivity on the rear face of this substrate is calculated. The axis of abscissa shows the incident angle, and the axis of ordinate shows the reflectivity. When the incident angle is changed, it is known that the reflectivity is also greatly changed. Even when such a laser beam is used and irradiated to a semiconductor film, etc., it is difficult to uniformly irradiate the laser beam, and it becomes a factor of a reduction in film quality. Even when the semiconductor device is manufactured by using such a semiconductor film, it becomes factors of reductions in operating characteristics and reliability.

There is also a telecentric fθ lens in which no incident angle of the laser beam to the substrate is changed even when the angle of the galvano mirror is changed. However, this telecentric fθ lens requires a size approximately equal to that of the substrate. Therefore, it is not practical when the large area substrate is processed.

SUMMARY OF THE INVENTION

Therefore, an object of the present invention is to provide a method and a device for constantly setting the energy distribution of the laser beam on the irradiating face, and irradiating the uniform laser beam to the above entire irradiating face. Another object of the present invention is to provide a laser irradiating method and a laser irradiating device for efficiently forming a crystalline semiconductor film having a crystal property close to that of a monocrystal even in the large area substrate. Further, another object of the present invention is to provide a manufacturing method of the semiconductor device including the above laser irradiating method in a process.

The construction of the invention relative to a laser irradiating device disclosed in this specification is characterized in that the laser irradiating device has plural lasers, a first means for forming the shapes of plural laser beams on an irradiating face in an elliptical shape or a rectangular shape; and a second means for moving irradiating positions of the plural laser beams on the irradiating face in a first direction and a direction reverse to the first direction, and moving the irradiating positions of the plural laser beams on the irradiating face in a second direction.

Another construction of the invention relative to the laser irradiating device is characterized in that the laser irradiating device has plural lasers, an irradiating face relatively slantingly arranged with respect to plural laser beams, the first means for forming the shapes of the plural laser beams on the irradiating face in an elliptical shape or a rectangular shape; and the second means for moving irradiating positions of the plural laser beams on the irradiating face in a first direction and a direction reverse to the first direction, and moving the irradiating positions of the plural laser beams on the irradiating face in a second direction.

In each of the above constructions, it is characterized in that each of the plural lasers is constructed by a solid laser of continuous oscillation or pulse oscillation. For example, a YAG laser, a $YVO_4$ laser, a YLF laser, a $YAlO_3$ laser, a glass laser, a ruby laser, an a lexandrite laser, a Ti:sapphire laser, etc. are used as this solid laser.

Further, in each of the above constructions, it is characterized in that said plural lasers are one or plural kinds selected from an Ar laser and a Kr laser.

Further, in each of the above constructions, it is characterized in that the means 1 has a cylindrical lens. Otherwise, it is characterized in that the first means has a convex lens, a cylindrical lens and a grading. The shapes of the laser beams on the irradiating face are formed in the elliptical shape or the rectangular shape and the laser beams can be efficiently irradiated by the first means.

Further, in each of the above constructions, it is characterized in that the means 2 is a stage. The stage is moved at least in the first direction, the direction reverse to the first direction, and the second direction. For example, an X-Y stage, etc. are used.

The construction of the invention relative to a laser irradiating method disclosed in this specification is characterized in that the shapes of plural laser beams on an irradiating face are formed in an elliptical shape or a rectangular shape by an optical system; the plural laser beams are irradiated while the irradiating face is moved in a first direction, and the irradiating face is moved in a second direction; and the plural laser beams are irradiated while the irradiating face is moved in a direction reverse to the first direction.

Another construction of the invention relative to the laser irradiating method is characterized in that the shapes of plural laser beams on an irradiating face slantingly arranged with respect to the plural laser beams are formed in an elliptical shape or a rectangular shape by an optical system; the plural laser beams are irradiated while the irradiating face is moved in a first direction; the irradiating face is moved in a second direction; and the plural laser beams are irradiated while the irradiating face is moved in a direction reverse to the first direction.

Another construction of the invention relative to the laser irradiating method is also characterized in that the shapes of plural laser beams on an irradiating face are formed in an elliptical shape or a rectangular shape by an optical system; the plural laser beams are irradiated while the irradiating face is moved in a first direction; the plural laser beams are irradiated while the irradiating face is moved in a direction reverse to the first direction; and the irradiating face is moved in a second direction.

Another construction of the invention relative to the laser irradiating method is also characterized in that the shapes of plural laser beams on an irradiating face slantingly arranged with respect to the plural laser beams are formed in an elliptical shape or a rectangular shape by an optical system; the plural laser beams are irradiated while the irradiating face is moved in a first direction; the plural laser beams are irradiated while the irradiating face is moved in a direction reverse to the first direction; and the irradiating face is moved in a second direction.

In each of the above constructions, the laser irradiating method is characterized in that the laser beams are oscillated from a solid laser of continuous oscillation or pulse oscillation. For example, the solid laser is constructed by a YAG laser, a YVO$_4$ laser, a YLF laser, a YAlO$_3$ laser, a glass laser, a ruby laser, an alexandrite laser, a Ti:sapphire laser, etc. of continuous oscillation or pulse oscillation.

In each of the above constructions, it is characterized in that the laser beams are oscillated from one or plural kinds selected from an Ar laser and a Kr laser.

In each of the above constructions, it is characterized in that a cylindrical lens is used as the optical system. Otherwise, it is characterized in that a convex lens and a cylindrical lens are used as the optical system.

Another construction of the invention relative to the manufacturing method of a semiconductor device disclosed in this specification is characterized in that a semiconductor film is formed on an insulating surface; the shapes of plural laser beams in the semiconductor film are formed in an elliptical shape or a rectangular shape by an optical system; the plural laser beams are irradiated while the semiconductor film is moved in a first direction; the semiconductor film is moved in a second direction; and the plural laser beams are irradiated while the semiconductor film is moved in a direction reverse to the first direction.

Another construction of the invention relative to the manufacturing method of the semiconductor device is also characterized in that a semiconductor film is formed on an insulating surface; the shapes of plural laser beams in the semiconductor film slantingly arranged with respect to the plural laser beams are formed in an elliptical shape or a rectangular shape by an optical system; the plural laser beams are irradiated while the semiconductor film is moved in a first direction; the semiconductor film is moved in a second direction; and the plural laser beams are irradiated while the semiconductor film is moved in a direction reverse to the first direction.

Another construction of the invention relative to the manufacturing method of the semiconductor device is also characterized in that a semiconductor film is formed on an insulating surface; the shapes of plural laser beams in the semiconductor film are formed in an elliptical shape or a rectangular shape by an optical system; the plural laser beams are irradiated while the semiconductor film is moved in a first direction; the plural laser beams are irradiated while the semiconductor film is moved in a direction reverse to the first direction; and the semiconductor film is moved in a second direction.

Another construction of the invention relative to the manufacturing method of the semiconductor device is also characterized in that a semiconductor film is formed on an insulating surface; the shapes of plural laser beams in the semiconductor film slantingly arranged with respect to the plural laser beams are formed in an elliptical shape or a rectangular shape by an optical system; the plural laser beams are irradiated while the semiconductor film is moved in a first direction; the plural laser beams are irradiated while the semiconductor film is moved in a direction reverse to the first direction; and the semiconductor film is moved in a second direction.

In each of the above constructions, it is characterized in that the laser beams are oscillated from a solid laser of continuous oscillation or pulse oscillation. For example, the solid laser is constructed by a YAG laser, a YVO$_4$ laser, a YLF laser, a YAlO$_3$ laser, a glass laser, a ruby laser, an alexandrite laser, a Ti:sapphire laser, etc. of continuous oscillation or pulse oscillation.

In each of the above constructions, it is characterized in that the laser beams are oscillated from one or plural kinds selected from an Ar laser and a Kr laser.

Further, in each of the above constructions, it is characterized in that a cylindrical lens is used as the optical system. Otherwise, it is characterized in that a convex lens and a cylindrical lens are used as the optical system.

BRIEF DESCRIPTION OF THE DRAWINGS

FIG. 3 is a view showing an example of the construction of the laser irradiating device.

FIGS. 6A to 6C are sectional views showing the manufacturing process of a pixel TFT and a TFT of a driving circuit.

FIGS. 7A to 7C are sectional views showing the manufacturing process of the pixel TFT and the TFT of the driving circuit.

FIG. 12A is a plan view of the light emitting device, and FIG. 12B is a sectional structural view of the driving circuit of the light emitting device and the pixel section.

DESCRIPTION OF THE PREFERRED EMBODIMENTS

The embodiment modes of the present invention will be explained by using FIG. 2.

First, each of plural laser beams is set by an optical system to laser beams 103a, 103b, 103c of an elliptical shape or a rectangular shape on an irradiating face. The shape of the laser beam is formed in the rectangular shape or the elliptical shape on the above irradiating face because the laser beam is efficiently irradiated to an entire substrate face. The shape of the laser beam emitted from the laser is different in accordance with the kind of the laser. For example, the size of the laser beam of XeCl excimer laser (wavelength 308 nm and pulse width 30 ns) L3308 manufactured by Lamda Corporation is 10 mm×30 mm (both are half-value widths in a beam profile). In the YAG laser, the shape of the laser beam is a circular shape if a rod shape is a cylindrical shape, and the shape of the laser beam is a rectangular shape if the YAG laser is of a slab type. The shape of the laser beam on the above irradiating face is set to the rectangular shape or the elliptical shape by the optical system.

The incident angle of each laser beam to the above irradiating face is set to the same. Thus, the energy distribution of each laser beam 103 on the above irradiating face is set to the same. This is very important to irradiate the uniform laser beam on the entire substrate face.

Figure 2A:
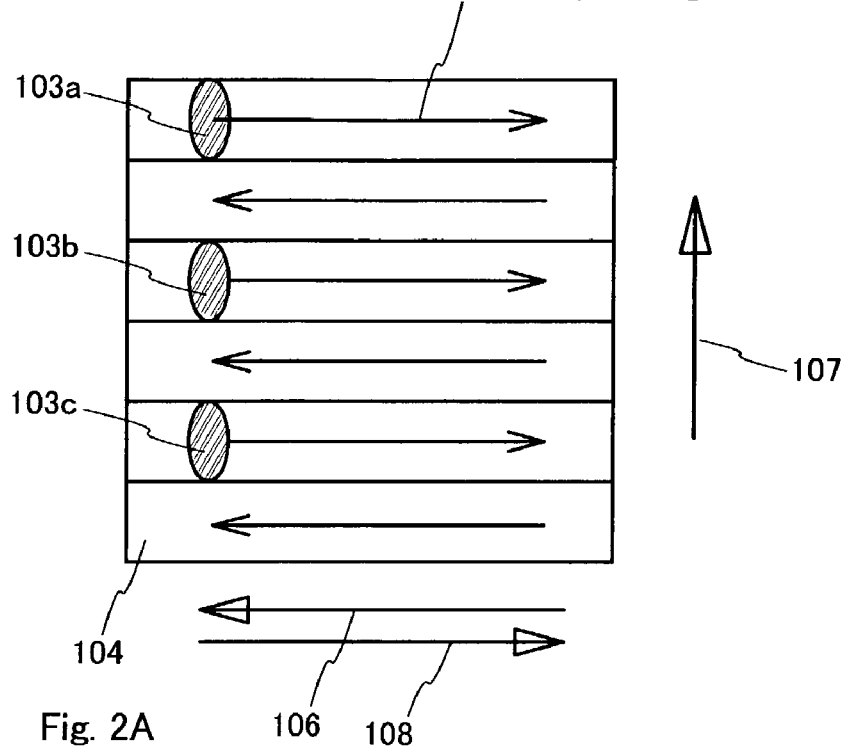
FIGS. 2A and 2B are views showing examples of a laser irradiating method on an irradiating face.

While the above laser beam 103 is irradiated, a stage (or the substrate) is moved in a direction shown by reference numeral 106. Subsequently, the stage (or the substrate) is moved in a direction shown by reference numeral 107, and is also moved in a direction shown by reference numeral 108 while the above laser beam 103 is irradiated. Thus, if the stage (or the substrate) is repeatedly moved while the incident position and the incident angle of the laser beam are fixed, the laser beam can be irradiated to the entire substrate face without changing the energy distribution of the laser beam on the irradiating face. Its situation is shown in FIG. 2A.

Figure 2B:
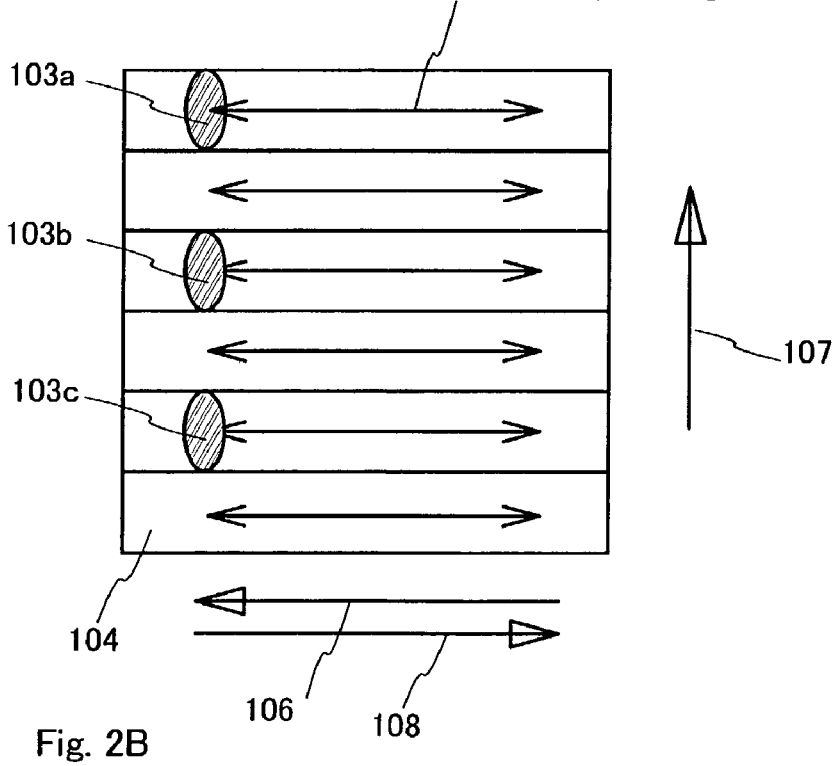

The same area is irradiated plural times by moving the stage (or the substrate) in the direction shown by reference numeral 106 and subsequently moving the stage (or the substrate) in the direction shown by reference numeral 108 while the above laser beam 103 is irradiated. However, after the same area is irradiated plural times, the stage (or the substrate) is moved in the direction shown by reference numeral 107, and the laser beam can be again irradiated. Its situation is shown in FIG. 2B.

Figure 16:
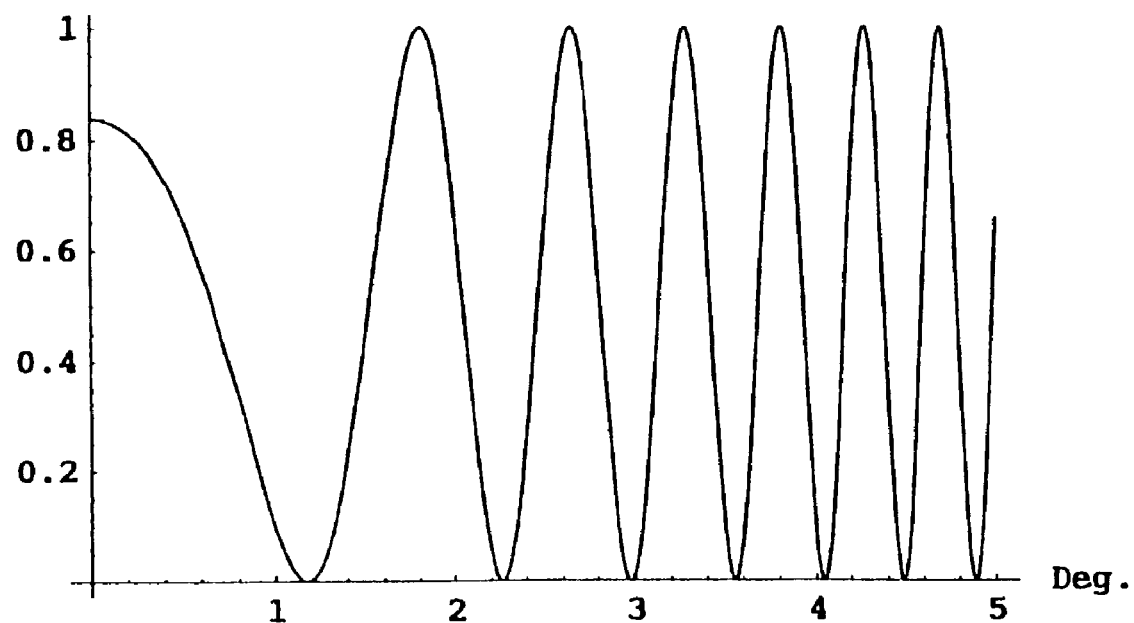
FIG. 16 is a view showing an example of reflectivity with respect to the incident angle of a laser beam.
Figure 17:
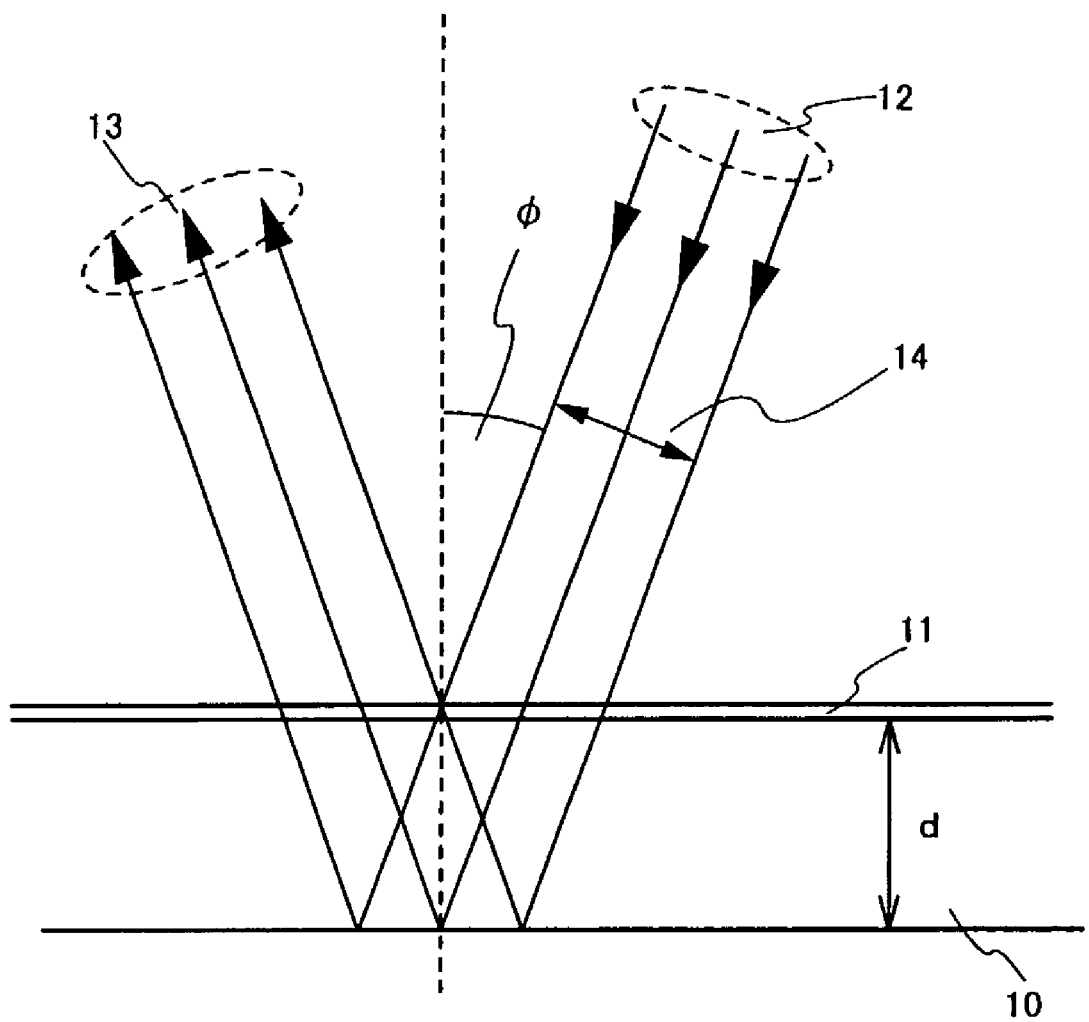
FIG. 17 is a view showing an example of the relation of the incident angle of the laser beam and interference.

If each incident angle is the same, the plural laser beams 103 can be also slantingly irradiated to the substrate 104. However, as shown in FIG. 16, reflectivity is greatly changed with respect to a change in the incident angle of the laser beam. Therefore, it is desirable to set the incident angle of each of the plural laser beams to be the same, or lie within an angle at which the change in reflectivity lies within 5%. As shown in FIG. 17, the laser beam is incident to the irradiating face with the beam width W. No interference is caused unless incident light and reflected light on the rear face of the substrate are overlapped. Namely, when the thickness of the substrate is set to d and the thickness of a semiconductor film is neglected since the thickness of the semiconductor film is smaller than the thickness of the above substrate, no interference is caused if the incident angle is greater than an incident angle φ satisfying $$\sin\phi = W/2d$$

$$\therefore \phi = \arcsin(W/2d).$$

Namely, no interference is caused when $$\phi \geq \arcsin(W/2d).$$

Therefore, when the laser beam is incident at an angle greater than the incident angle φ, it is not necessary to strictly conform the incident angles of the plural laser beams.

A condition for generating the interference is changed by the wavelength of the laser beam, a coherence length, the absorption coefficient and the film thickness of an irradiated object such as a semiconductor film, etc. Accordingly, it is necessary to consider arrangements of the optical system and the irradiated object.

In this embodiment mode, the plural laser beams are used, but may be also oscillated by using plural lasers, and may be also formed by dividing the laser beams oscillated from one laser. Further, the number of laser beams is not limited to three, but is not particularly limited if this number is a plural number equal to or greater than 2.

Here, the case of crystallization of the semiconductor film using such an irradiating method will be explained. When the laser beam is irradiated to the semiconductor film, the irradiated area attains a melting state and is cooled and solidified with the passage of time. If the laser beam is irradiated while the laser beam is moved, the area in the melting state is successively formed, and the area cooled and solidified with the passage of time also exists. Namely, a temperature gradient is formed in the semiconductor film, and a crystal grain is grown along a moving direction of the laser beam so that the crystal grain of a large diameter is formed. The electrical characteristics of a TFT manufactured by using such a crystal grain in a channel forming area are improved and the operating characteristics and reliability of a semiconductor device can be also improved. Since there is particularly almost no crystal grain boundary in the moving direction of the laser beam, it is preferable to manufacture the TFT having the channel forming area parallel to this direction.

If such an irradiating method is used, the laser beam can be also efficiently irradiated to the large area substrate. Further, when the semiconductor film is crystallized by irradiating such a laser beam, it is possible to form the semiconductor film having the crystal grain of a large diameter close to that of a monocrystal. Further, the electrical characteristics of the TFT manufactured by using the above semiconductor film are improved and the operating characteristics and reliability of the semiconductor device can be also improved.

The present invention having the above construction will be explained in further detail by the embodiments shown below.

EMBODIMENTS

Embodiment 1

In this embodiment, a method for slantingly irradiating the plural laser beams to the substrate will be explained by using FIGS. 1, 2A, 2B, 18 and 19.

Each of the plural laser beams 101a, 101b, 101c is shortened in the short side direction by cylindrical lenses 102a, 102b, 102c, and becomes laser beams 103a, 103b, 103c having an elliptical shape or a rectangular shape on an irradiating face. In order to form a laser beam having an elliptical shape or a rectangular shape on an irradiating face, a grating may be used. If a stage (or the substrate) is moved in a direction shown by reference numeral 106, the laser beam can be irradiated in a direction shown by reference numeral 108 without changing the incident angle of the laser beam to the substrate. When the irradiation of the laser beam in the direction shown by reference numeral 108 is terminated, the stage (or the substrate) is moved in a direction shown by reference numeral 107. The laser beam can be irradiated in the direction shown by reference numeral 106 if the stage (or the substrate) is moved in the direction shown by reference numeral 108 while the laser beam is irradiated. The laser beam is irradiated to the entire substrate face by repeating these movements. FIG. 2A shows a situation in which the laser beam is irradiated to the entire substrate face at this time.

In another moving method of the stage (or the substrate), the stage (or the substrate) may be also moved in the direction shown by reference numeral 107 after the stage (or the substrate) is moved in the direction shown by reference numeral 106 and is moved in the direction shown by reference numeral 108. The stage (or the substrate) may be also moved in the direction shown by reference numeral 107 after the movement of the stage (or the substrate) in the direction shown by reference numeral 106 and the movement of the stage (or the substrate) in the direction shown by reference numeral 108 are repeated. FIG. 2B shows a situation in which the laser beam is irradiated to the entire substrate face at this time. On the other hand, the plurality of laser beams themselves may be moved while irradiating, and both the plurality of laser beams and the stage (or the substrate) may moved.

Figure 1:
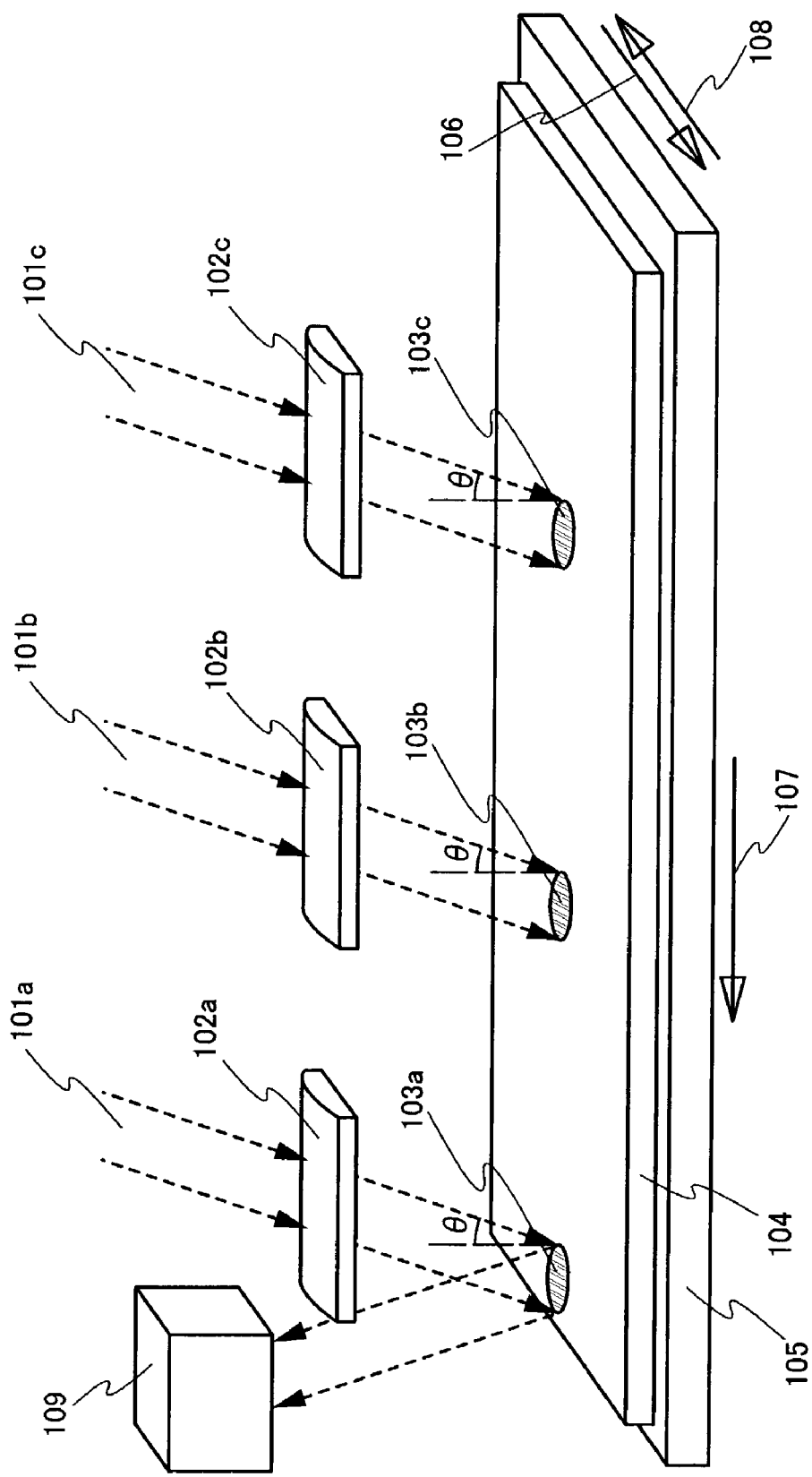
FIG. 1 is a view showing an example of the construction of a laser irradiating device.

The laser beam incident to the substrate is reflected on the surface of the substrate. However, since the laser beam is light having high directivity and energy density, it is preferable to absorb the above reflected light by arranging a damper 109 to prevent the reflected light from being irradiated to an unsuitable portion. Cooling water is circulated in the damper 109 although the cooling water is not illustrated in the drawings. The cooling water prevents the temperature of the damper 109 from being raised by the absorption of the reflected light. In FIG. 1, the damper 109 is illustrated with respect to only the laser beam 101a, but is also preferably arranged with respect to other laser beams 101b, 101c.

As shown in FIG. 16, when the incident angle of the laser beam is changed, reflectivity is greatly changed. Therefore, it is very important to set the incident angles of the plural laser beams to the same. It is most desirable to set the incident angles of the plural laser beams to an angle providing a minimum value of reflectivity. It is also preferable to set the incident angle such that a change in reflectivity lies within 5%. Since the reflectivity is changed by the thickness and the refractive index of the substrate and the wavelength, an operator may suitably determine the incident angle.

Thus, if the laser beam is irradiated to the substrate, the laser beam having the same energy distribution is irradiated to the substrate so that the laser beam can be uniformly irradiated. It is also possible to obtain the semiconductor film having a crystal grain close to that of a monocrystal. Further, since the plural laser beams are used, throughput is improved and the laser beams can be efficiently irradiated.

Figure 18:
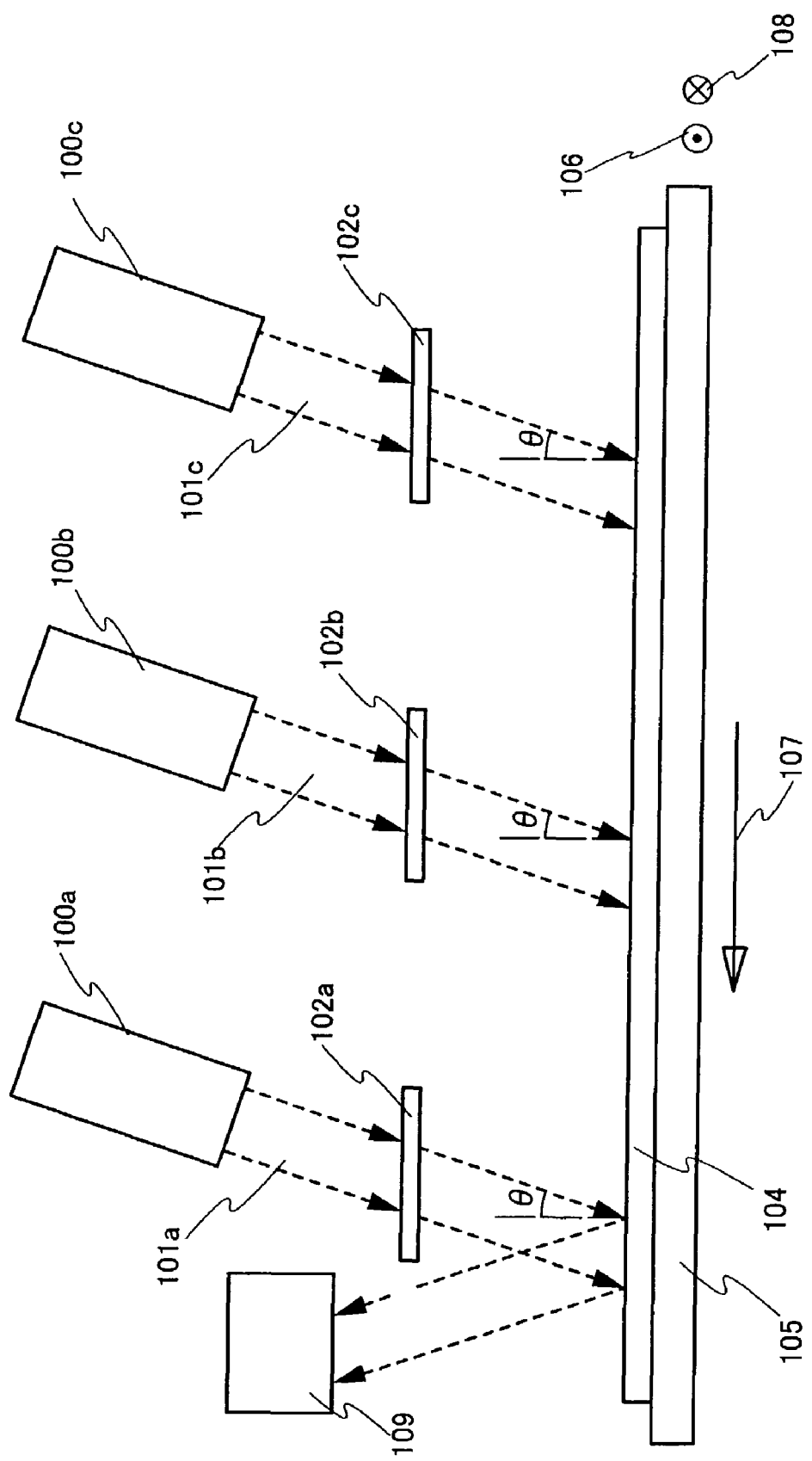
FIG. 18 is a view showing an example of the construction of the laser irradiating device.
Figure 19:
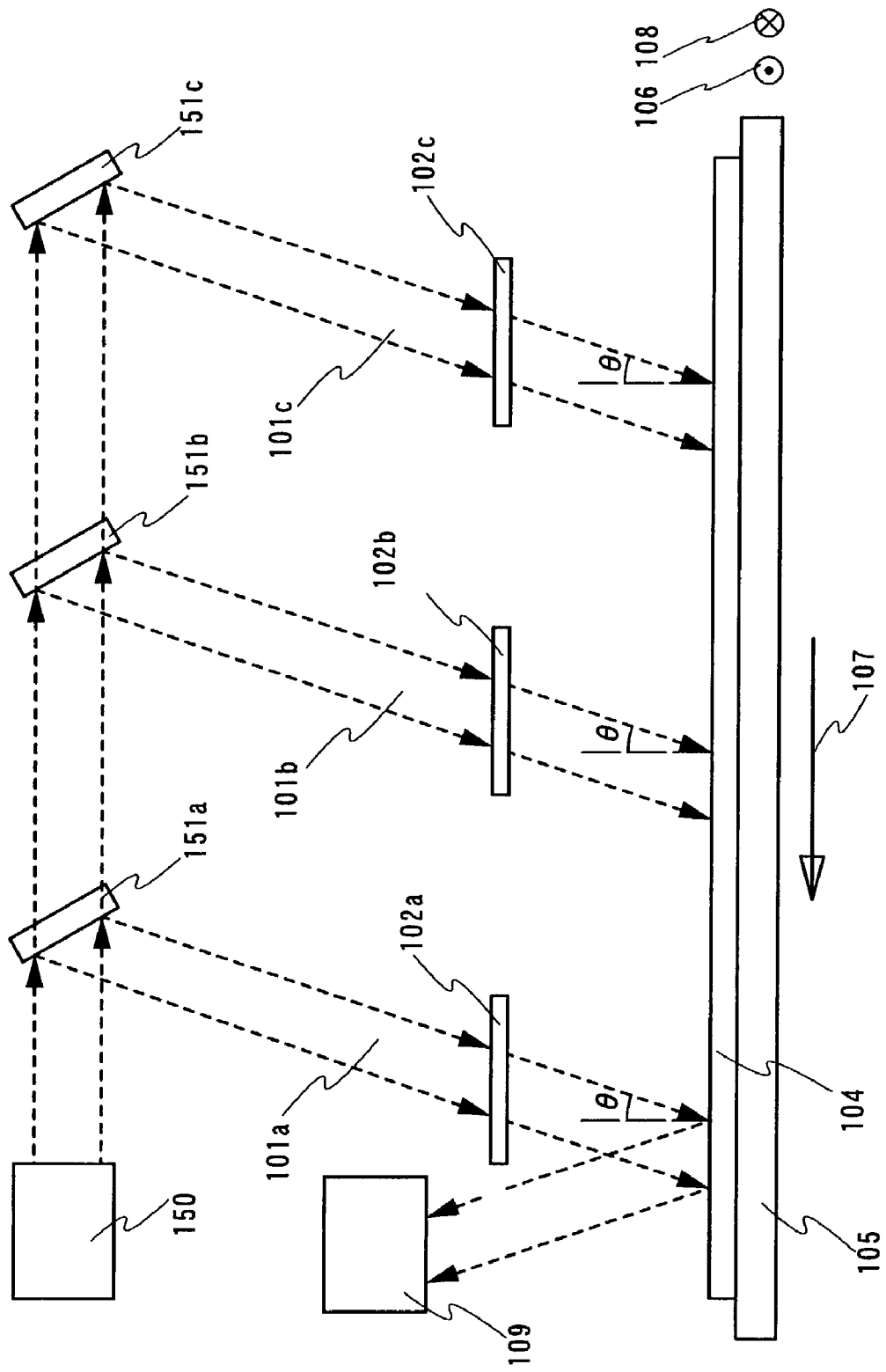
FIG. 19 is a view showing an example of the construction of the laser irradiating device.

In this embodiment, the plural laser beams are used. However, as shown in FIG. 18, plural lasers 100 may be slantingly arranged with respect to the substrate 104, and plural laser beams may be also oscillated by using these plural lasers 100. As shown in FIG. 19, the laser beam oscillated from one laser 150 is divided by beam splitters 151a, 151b, etc. and may be also set to plural laser beams 101. Further, the number of laser beams is not limited to three, but is not particularly limited if this number is equal to or greater than 2.

In this embodiment, the substrate is horizontally arranged, and the incident angle of the laser beam is inclined by an angle θ with respect to the substrate. However, the incident angle of the above laser beam to the above substrate may be also inclined by slantingly arranging the substrate by the angle θ with respect to the horizontal direction.

Embodiment 2

In this embodiment, a method for irradiating the plural laser beams from a direction perpendicular to the substrate will be explained by using FIG. 3.

The laser beams 110a, 110b, 110c oscillated from the laser is shortened by cylindrical lenses 112a, 112b, 112c in the short side direction, and is changed to laser beams 113a, 113b, 113c having an elliptical shape or a rectangular shape on an irradiating face. In order to form a laser beam having an elliptical shape or a rectangular shape on an irradiating face, a grating may be used. If the stage (or the substrate) is moved in a direction shown by reference numeral 106, the laser beam can be irradiated in a direction shown by reference numeral 108 without changing the incident angle of the laser beam to the substrate. When the irradiation of the laser beam in the direction shown by reference numeral 106 is terminated, the stage (or the substrate) is moved in a direction shown by reference numeral 107. The laser beam can be irradiated in the direction shown by reference numeral 106 if the stage (or the substrate) is moved in the direction shown by reference numeral 108 while the laser beam is irradiated. The laser beam is irradiated to the entire substrate face by repeating these movements.

In another moving method of the stage (or the substrate), the stage (or the substrate) may be also moved in the direction shown by reference numeral 107 after the stage (or the substrate) is moved in the direction shown by reference numeral 106 and is moved in the direction shown by reference numeral 108. Further, the stage (or the substrate) may be also moved in the direction shown by reference numeral 107 after the movement in the direction shown by reference numeral 106 and the movement in the direction shown by reference numeral 108 is repeated. On the other hand, the plurality of laser beams themselves may be moved while irradiating, and both the plurality of laser beams and the stage (or the substrate) may moved.

The laser beam incident to the substrate is reflected on the surface of the substrate, and becomes so-called return light returned along the same optical path as the incident time. This return light has a bad influence on the output of the laser, a change in frequency, the destruction of a rod, etc. Therefore, an isolator 111 is preferably arranged to remove this return light and stabilize the oscillation of the laser.

Thus, if the laser beam is irradiated to the substrate, the laser beam having the same energy distribution is irradiated to the substrate so that the laser beam can be uniformly irradiated. Further, it is possible to obtain a semiconductor film having a crystal grain close to that of a monocrystal. Further, since the plural laser beams are used, throughput is improved and the laser beams can be efficiently irradiated. In this embodiment, the plural laser beams are used, but may be also oscillated by using plural lasers, and may be also formed by dividing the laser beam oscillated from one laser. Further, the number of laser beams is not limited to three, but is not particularly limited if this number is equal to or greater than 2.

Embodiment 3

Figure 4:
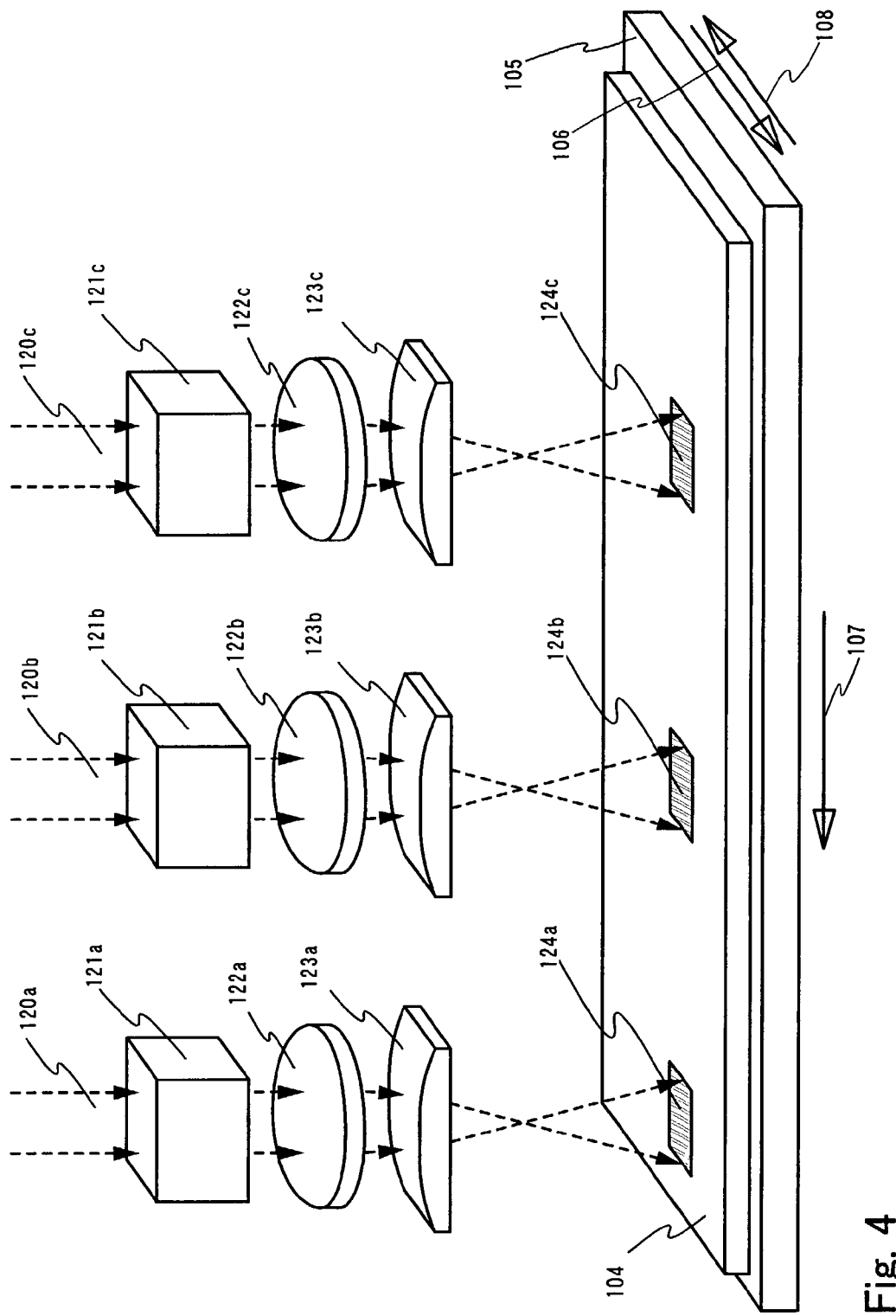
FIG. 4 is a view showing an example of the construction of the laser irradiating device.
Figure 5:
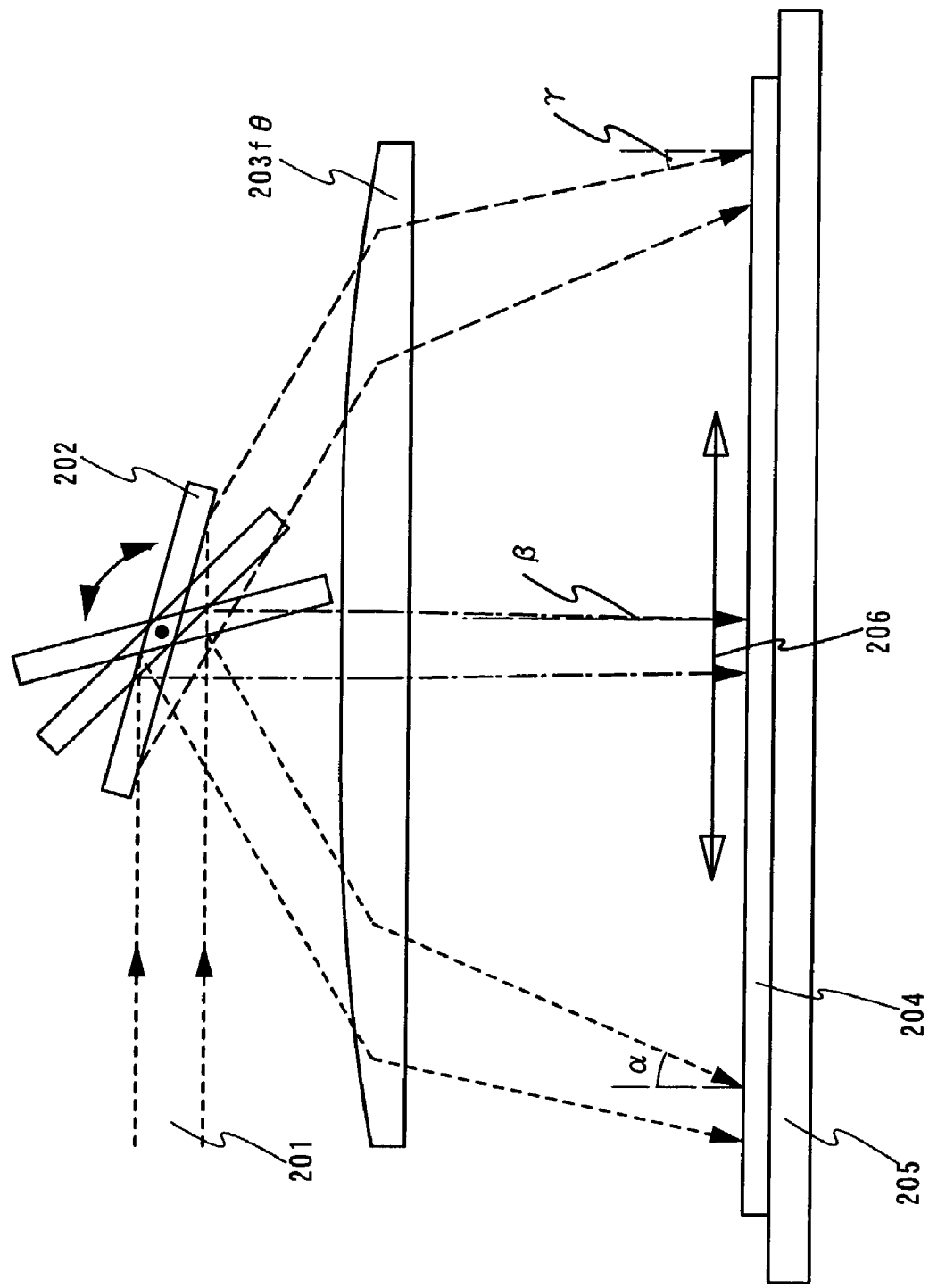
FIG. 5 is a view showing an example of the construction of the laser irradiating device.

In this embodiment, a method for irradiating the laser beam from the direction perpendicular to the substrate by using plural lasers having the rod shape of a slab type will be explained by using FIG. 4.

The laser beams 120a, 120b, 120c oscillated from the laser is shortened in the longitudinal direction and the transversal direction by convex lenses 122a, 122b, 122c. This laser beam 120 is converged by cylindrical lenses 123a, 123b, 123c in the longitudinal direction and is then enlarged, and becomes laser beams 124a, 124b, 124c having a rectangular shape on an irradiating face. In order to form a laser beam having an elliptical shape or a rectangular shape on an irradiating face, a grating may be used. If the stage (or the substrate) is moved in a direction shown by reference numeral 106, the laser beam can be irradiated in a direction shown by reference numeral 108 without changing the incident angle of the laser beam to the substrate. When the irradiation of the laser beam in the direction shown by reference numeral 108 is terminated, the laser beam can be irradiated in the direction shown by reference to numeral 106 if the stage (or the substrate) is moved in a direction shown by reference numeral 107 and is moved in the direction shown by reference numeral 108 while the laser beam is irradiated. The laser beam is irradiated to the entire substrate face by repeating these movements.

In the moving method of the stage (or the substrate), the stage (or the substrate) may be also moved in the direction shown by reference numeral 107 after the stage (or the substrate) is moved in the direction shown by reference numeral 106 and is moved in the direction shown by reference numeral 108. Further, the stage (or the substrate) may be also moved in the direction shown by reference numeral 107 after the movement in the direction shown by reference numeral 106 and the movement in the direction shown by reference numeral 108 is repeated. On the other hand, the plurality of laser beams themselves may be moved while irradiating, and both the plurality of laser beams and the stage (or the substrate) may moved.

The laser beam incident to the substrate is reflected on the surface of the substrate, and becomes so-called return light returned along the same optical path as the incident time. This return light has a bad influence on the output of the laser, a change in frequency, the destruction of a rod, etc. Therefore, an isolator 111 is preferably arranged to remove this return light and stabilize the oscillation of the laser.

Thus, if the laser beam is irradiated to the substrate, the laser beam having the same energy distribution is irradiated to the substrate so that the laser beam can be uniformly irradiated. Further, it is possible to obtain a semiconductor film having a crystal grain close to that of a monocrystal. Further, since the plural laser beams are used, throughput is improved and the laser beams can be efficiently irradiated. In this embodiment, the plural laser beams are used, but may be also oscillated by using plural lasers, and may be also formed by dividing the laser beam oscillated from one laser. Further, the number of laser beams is not limited to three, but is not particularly limited if this number is equal to or greater than 2.

Embodiment 4

In this embodiment, a method of manufacturing an active matrix substrate will be described with reference to FIGS. 6 to 9. A substrate on which a CMOS circuit, a driving circuit, and a pixel portion having a pixel TFT and a storage capacitor are formed together is called active matrix substrate for convenience.

First of all, a substrate 400 formed of glass such as barium borosilicate glass and aluminum borosilicate glass is used in this embodiment. The substrate 400 may be a quartz substrate, a silicon substrate, a metal substrate or stainless substrate, which has an insulating film on the surface. The substrate 400 may be a plastic substrate having heat resistance, which withstands a processing temperature in this embodiment.

Next, a primary film 401 having an insulating film such as silicon oxide film, silicon nitride film, and a silicon oxynitride film is formed on the substrate 400. In this embodiment, a two-layer structure is used for the primary film 401. However, a structure may be used where a single layer film, which is the insulating film itself, or at least two layers are stacked. As a first layer of the primary film 401, a silicon oxynitride film 401a is formed 10 to 200 nm (preferably 50 to 100 nm) thick by using $SiH_4$, $NH_3$ and $N_2O$ as a reaction gas in accordance with the plasma CVD method. In this embodiment, a silicon oxynitride film 401a (compositional ratio: Si=32%, O=27%, N=24% and H=17%) was formed with a thickness of 50 nm. Next, as a second layer of the primary film 401, a silicon oxynitride film 401b is formed with a thickness of 50 to 200 nm (preferably 100 to 150 nm) by using $SiH_4$ and $N_2O$ as a reaction gas in accordance with the plasma CVD method. In this embodiment, a silicon oxynitride film 401b (compositional ratio: Si=32%, O=59%, N=7% and H=2%) is formed with a thickness of 100 nm.

Next, semiconductor layers 402 to 406 are formed on the primary film. First of all, semiconductor film is formed with a thickness of 25 to 80 nm (preferably 30 to 60 nm) by a publicly known method (such as the sputtering method, LPCVD method and plasma CVD method). Then the semiconductor film is crystallized by laser crystallization method. Of course, in addition to the laser crystallization method, other known crystallization method (thermal crystallization method using RTA or a furnace annealing and thermal crystallization method using a metal element facilitating the crystallization) can be used. Patterning is performed on the obtained crystalline semiconductor film in a desired form in order to form the semiconductor layers 402 to 406. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film.

When a crystalline semiconductor film is produced in accordance with the laser crystallization method, the pulse oscillation type or the continuous light-emitting type of excimer laser, Ar laser, Kr laser, YAG laser, $YVO_4$ laser, YLF laser, $YAlO_3$ laser, glass laser, ruby laser, alexandrite laser, Ti: sapphire laser or the like may be applied. When these types of laser are used, a method is preferable whereby laser light emitted from a laser oscillator is gathered in rectangular shape or elliptic shape by optical system and is irradiated to a semiconductor film. A condition of the crystallization is properly selected by executors.

In this embodiment, an amorphous silicon film with a thickness of 55 nm is formed by plasma CVD method. Then crystallization is performed by optical system as shown in FIGS. 1, 3 or FIG. 4 by using a second hermetic of continuous light-emitting type of $YVO_4$ laser, whereby forming the crystalline silicon film. According to a patterning process of the crystalline silicon film using a photolithography method, the semiconductor layers 402 to 406 are formed.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using an insulating film 40 to 150 nm thick containing silicon in accordance with plasma CVD method or sputtering method. In this embodiment, a silicon oxynitride film (compositional ratio: Si=32%, 0=59%, N=7% and H=2%) with a thickness of 110 nm is formed in accordance with the plasma CVD method. Notably, the gate insulating film is not limited to the silicon oxynitride film but an insulating film containing other silicon may be used as a single layer or as a laminated structure.

When a silicon oxide film is used, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 $W/cm^2$. Thermal annealing at 400 to 500° C. thereafter can give good characteristics to the silicon oxide film produced in this way as a gate insulating film.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film with a thickness of 30 nm and the second conductive film 409 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 μΩcm or below. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 408 is TaN and the second conductive film 409 is W, they are not limited in particular. Both of them can be formed by an element selected from Ta, W, Ti, Mo, Al, Cu, Cr and Nd or an alloy material or a compound material containing the element as its main constituent. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Next, masks 410 to 415 made of resist using photolithography method are formed, and first etching processing is performed thereon in order to form electrodes and wirings. The first etching processing is performed under first and second etching conditions (FIG. 6B). The first etching condition in this embodiment is to use Inductively Coupled Plasma (ICP) etching and to use $CF_4$ and $Cl_2$ and $O_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. Here, a dry etching device using ICP (Model E645-□ICP) manufactured by Matsushita Electric Industrial Co., Ltd was used. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 410 to 415 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the form of the mask made of resist is appropriate, the form of the ends of the first and the second conductive layers are in the tapered form due to the effect of the bias voltage applied to the substrate side. The angle of the tapered portion is 15 to 45°. Thus, conductive layers 417 to 422 in a first form are formed which include the first conductive layers and the second conductive layers (first conductive layers 417a to 422a and second conductive layer 417b to 422b) through the first etching processing. Reference numeral 416 is a gate insulating film. In the gate insulating film 416, an area not covered by the first conductive layers 417 to 422 is etched by about 20 to 50 nm so as to form a thinner area.

Next, second etching processing is performed without removing masks made of resist (FIG. 6C). Here, $CF_4$, $Cl_2$ and $O_2$ are used to etch the W film selectively. Then, second conductive layers 428b to 433b are formed by the second etching processing. On the other hand, the first conductive layers 417a to 422a are not etched very much, and conductive layers 428 to 433 in the second form are formed.

First doping processing is performed without removing masks made of resist and low density of impurity element, which gives n-type to the semiconductor layer, is added. The doping processing may be performed in accordance with the ion-doping method or the ion-implanting method. The ion doping method is performed under a condition in the dose of $1 \times 10^{13}$ to $5 \times 10^{14}/cm^2$ and the accelerating voltage of 40 to 80 keV. In this embodiment, the ion doping method is performed under a condition in the dose of $1.5 \times 10^{13}/cm^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity areas 423 to 427 are formed in the self-alignment manner. An n-type doping impurity element in the density range of $1 \times 10^{18}$ to $1 \times 10^{20}/cm^3$ is added to the impurity areas 423 to 427.

When masks made of resist are removed, new masks 434a to 434c made of resist are formed. Then, second doping processing is performed by using higher accelerating voltage than that used in the first doping processing. The ion doping method is performed under a condition in the dose of $1 \times 10^{13}$ to $1 \times 10^{15}/cm^2$ and the accelerating voltage of 60 to 120 keV. In the doping processing, the second to conductive layers 428b to 432b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 7A. The ion doping method is performed under a condition in the dose of $1 \times 10^{15}$ to $1 \times 10^{17}/cm^2$ and the accelerating voltage of 50 to 100 keV. Through the second doping processing and the third doping processing, an n-type doping impurity element in the density range of $1 \times 10^{18}$ to $5 \times 10^{19}/cm^3$ is added to the low density impurity areas 436, 442 and 448, which overlap with the first conductive layer. An n-type doping impurity element in the density range of $1 \times 10^{19}$ to $5 \times 10^{21}/cm^3$ is added to the high density impurity areas 435, 441, 444 and 447.

With proper accelerating voltage, the low density impurity area and the high density impurity area can be formed by performing the second doping processing and the third doping processing once.

Next, after removing masks made of resist, new masks 450a to 450c made of resist are formed to perform the fourth doping processing. Through the fourth doping processing, impurity areas 453, 454, 459 and 460, to which an impurity element doping a conductive type opposite to the one conductive type is added, in a semiconductor layer, which is an active layer of a P-channel type TFT. First conductive layers 428a to 432a are used as mask against the impurity element, and the impurity element giving p-type is added so as to form impurity areas in the self-alignment manner. In this embodiment, the impurity areas 453, 454, 459 and 460 are formed by applying ion-doping method using diborane ($B_2H_6$) (FIG. 7B). During the fourth doping processing, the semiconductor layer forming the n-channel TFT is covered by masks 450a to 450c made of resist. Thorough the first to the third doping processing, phosphorus of different densities is added to each of the impurity areas 453 and 454. Doping processing is performed such that the density of p-type doping impurity element can be $1 \times 10^{19}$ to $5 \times 10^{21}$ atoms/$cm^3$ in both areas. Thus, no problems are caused when they function as the source region and the drain region of the p-channel TFT.

Impurity areas are formed in the semiconductor layers, respectively, through the processes above.

Next, the masks 450a to 450c made of resist are removed and a first interlayer insulating film 461 is formed thereon. The first interlayer insulating film 461 may be an insulating film 100 to 200 nm thick containing silicon, which is formed by plasma CVD method or sputtering method. In this embodiment, silicon oxynitride film 150 nm thick is formed by plasma CVD method. The first interlayer insulating film 461 is not limited to the silicon oxynitride film but may be the other insulating film containing silicon in a single layer or in a laminated structure.

Next, as shown in FIG. 7C, thermal processing is performed to recover the crystalline characteristic of the semiconductor layers and to activate the impurity element added to each of the semiconductor layer. The heating processing is performed by thermal annealing method using an annealing furnace. The thermal annealing method may be performed in an atmosphere of nitrogen with the oxygen density of 1 ppm or below, preferably 0.1 ppm or below, at 400 to 700° C., typically at 500 to 550° C. In this embodiment, the activation processing is performed through thermal processing at 550° C. for four hours. In addition to the thermal annealing method, laser annealing method or rapid thermal annealing method (RTA method) may be applied.

Alternatively, the heating processing may be performed before the first interlayer insulating film is formed. However, when a wiring material in use is sensitive to heat, the activation processing is preferably performed after an inter-layer insulating film (insulating film containing silicon as its main constituent such as silicon nitride film) for protecting the wirings like this embodiment.

After the heating processing (thermal processing at 300 to 550° C. for one to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating processing in an atmosphere containing 3 to 100% of hydrogen at 300 to 450° C. for 1 to 12 hours.

When laser annealing method is used for the activation processing, laser light such as excimer laser and YAG laser is desirably irradiated after the hydrogenation is performed.

Next, a second interlayer insulating film 462 formed by an inorganic insulating material or an organic insulating material is formed on the first interlayer insulating film 461. In this embodiment, an acrylic resin film with a thickness of 1.6 μm is formed, whose viscosity is 10 to 1000 cp, preferably 40 to 200 cp and which has depressions and projections formed on the surface.

In this embodiment, in order to prevent mirror reflection, a second interlayer insulating film having projections and depressions (not shown) on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same mask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as publicly known sand-blast method and etching method. Preferably, by preventing mirror reflection and by dispersing reflected light, the whiteness is increased.

Figure 8:
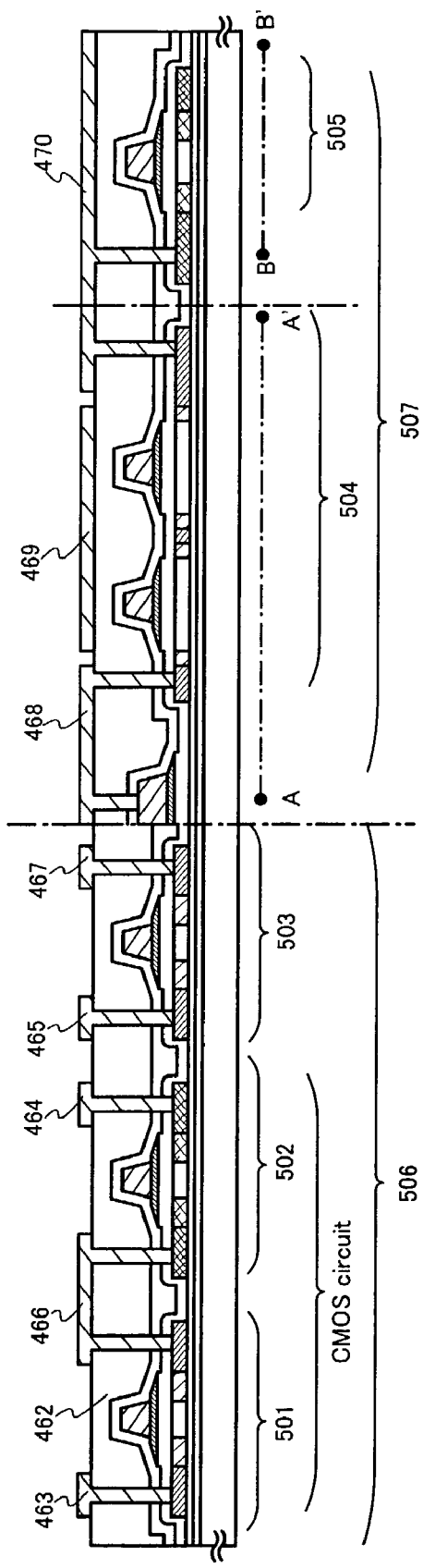
FIG. 8 is a sectional view showing the manufacturing process of the pixel TFT and the TFT of the driving circuit.

Wirings 463 to 467 electrically connecting to impurity areas, respectively, are formed in a driving circuit 506. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 8).

In a pixel portion 507, a pixel electrode 470, a gate wiring 469 and a connecting electrode 468 are formed. Source wirings (a laminate of layers 433*a* and 433*b*) are electrically connected with a pixel TFT by the connecting electrode 468. The gate wiring 469 is electrically connected with a gate electrode of the pixel TFT. A pixel electrode 470 is electrically connected with a drain region of the pixel TFT. Furthermore, the pixel electrode 470 is electrically connected with a semiconductor layer functioning as one electrode forming a storage capacitor. Desirably, a material having excellent reflectivity such as a film containing Al or Ag as its main constituent or the laminate film is used for the pixel electrode 470.

In this way, the driving circuit 506 having a CMOS circuit including an n-channel TFT 501 and a p-channel TFT 502 and a n-channel TFT 503, and the pixel portion 507 having the pixel TFT 504 and the storage capacitor 505 can be formed on the same substrate. Thus, an active matrix substrate is completed.

The n-channel TFT 501 of the driving circuit 506 has a channel formed area 437, a low density impurity area 436 overlapping with the first conductive layer 428*a*, which constructs a part of the gate electrode (GOLD area), and a high density impurity area 452 functioning as the source region or the drain region. The p-type channel TFT 502 forming a CMOS circuit together with the n-channel TFT 501, which are connected by an electrode 466, has a channel formed area 440, a high density impurity area 453 functioning as the source region or the drain region, and a low density impurity area 454. The n-channel TFT 503 has a channel formed area 443, a low density impurity area 442 overlapping with the first conductive layer 430*a*, which constructs a part of the gate electrode, (GOLD area), a high density impurity area 456 functioning as the source region or the drain region.

The pixel TFT 504 of the pixel portion has a channel formed area 446, a low density impurity area 445 formed outside of the gate electrode (LDD region) and a high density impurity area 458 functioning as the source region or the drain region. An n-type doping impurity element and a p-type doping impurity element are added to a semiconductor layer functioning as one electrode of the storage capacitor 505. The storage capacitor 505 is formed by an electrode (a laminate of layers 432*a* and 432*b*) and a semiconductor layer by using the insulating film 416 as a dielectric.

The pixel structure in this embodiment is arranged such that light can be blocked in a space between pixel electrodes and the ends of the pixel electrodes can overlap with the source wiring without using the black matrix.

Figure 9:
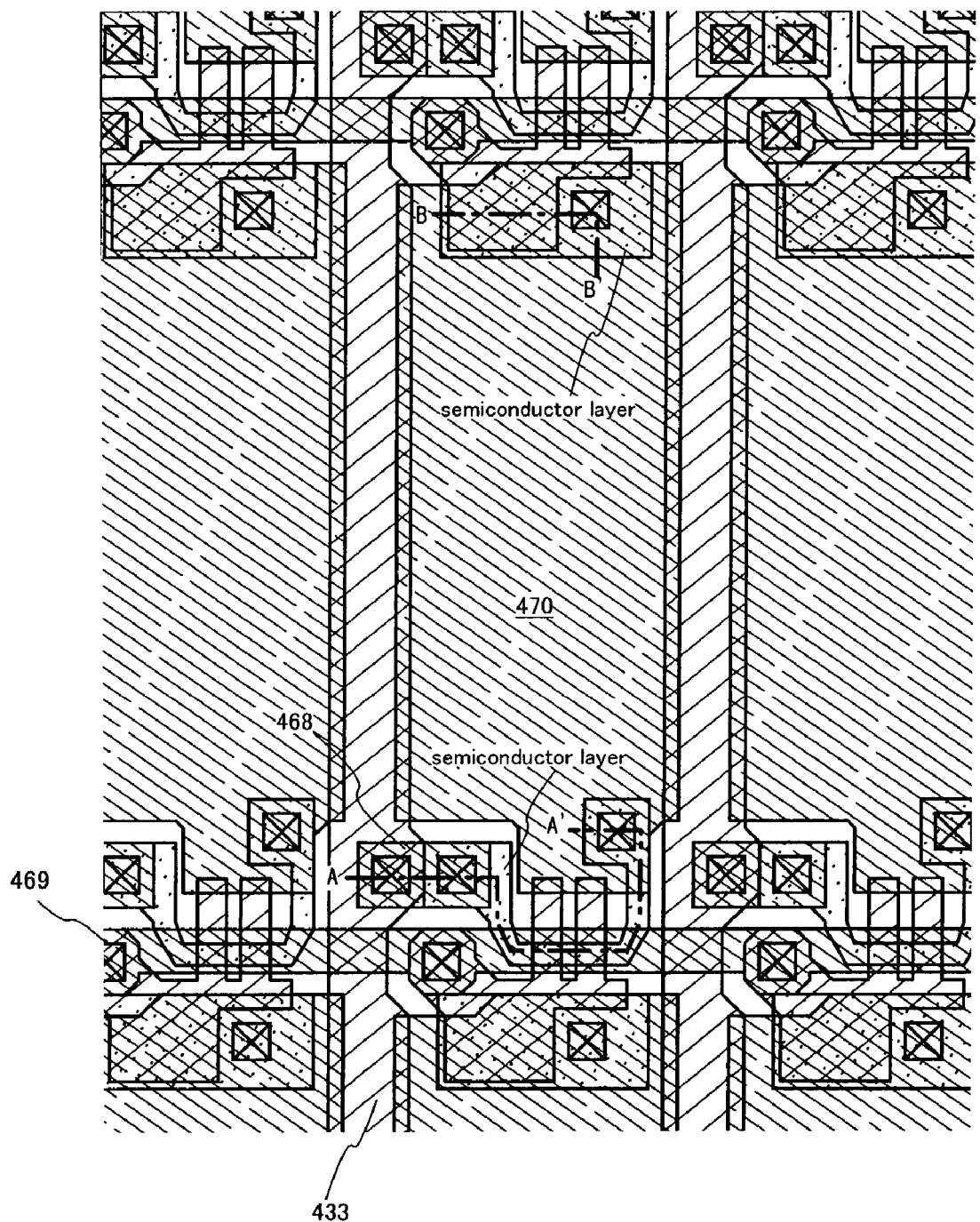
FIG. 9 is a plan view showing the construction of the pixel TFT.

FIG. 9 shows a top view of the pixel portion of the active matrix substrate produced in this embodiment. The same reference numerals are used for the corresponding parts in FIGS. 6A to 9. A broken line A-A' in FIG. 8 corresponds to a sectional view taken along a broken line A-A' in FIG. 9. A broken line B-B' in FIG. 8 corresponds to a sectional view taken along a broken line B-B' in FIG. 9.

It should be noted that this example can be combined with any one of embodiments 1 to 3 freely.

Embodiment 5

Figure 10:
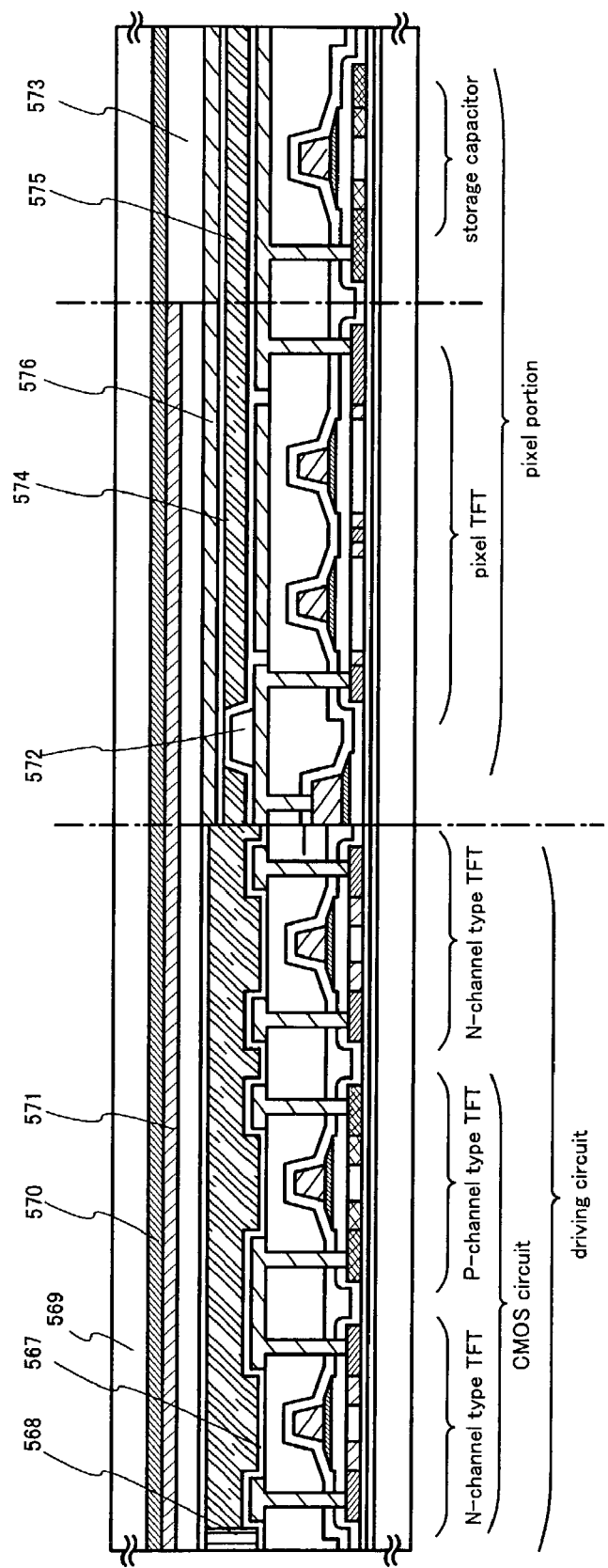
FIG. 10 is a sectional view showing the manufacturing process of an active matrix type liquid crystal display device.

This embodiment explains, below, a process to manufacture a reflection type liquid crystal display device from the active matrix substrate made in the fourth embodiment, using FIG. 10.

First, after obtaining an active matrix substrate in the state of FIG. 8 according to the fourth embodiment, an orientation film 567 is formed at least on the pixel electrodes 470 on the active matrix substrate of FIG. 8 and subjected to a rubbing process. Incidentally, in this embodiment, prior to forming an orientation film 567, an organic resin film such as an acryl resin film is patterned to form columnar spacers 572 in a desired position to support the substrates with spacing. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on a counter substrate 569. A shade portion is formed by overlapping a red coloring layer 570 and a blue coloring layer 571 together. Meanwhile, the shade portion may be formed by partly overlapping a red coloring layer and a green coloring layer.

In this embodiment is used a substrate shown in the fourth embodiment. Accordingly, in FIG. 9 showing a top view of the pixel portion of the fourth embodiment, there is a need to shade at least the gap between the gate wiring 469 and the pixel electrode 470, the gap between the gate wiring 469 and the connecting electrode 468 and the gap between the connecting electrode 468 and the pixel electrode 470. In this embodiment were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 576 of a transparent conductive film is formed on the planarizing film 573 at least in the pixel portion. An orientation film 574 is formed over the entire surface of the counter substrate and subjected to a rubbing process.

Then, the active matrix substrate formed with the pixel portion and driving circuit and the counter substrate are bonded together by a seal member 568. The seal member 568 is mixed with filler so that the filler and the columnar spacers bond together the two substrates through an even spacing. Thereafter, a liquid crystal material 575 is poured between the substrates, and completely sealed by a sealant (not shown). The liquid crystal material 575 may be a known liquid crystal material. In this manner, completed is a reflection type liquid crystal display device shown in FIG. 10. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as mentioned above is fabricated by using a semiconductor film having a crystal grain of a large grain size. Therefore, it is possible to obtain enough operating characteristic and good reliability. The liquid crystal display device manufactured as above can be used as a display portion for an electronic appliance in various kinds.

Incidentally, this embodiment can be freely combined with the embodiments 1 to 4.

Embodiment 6

This embodiment explains an example of a light-emitting device manufactured by using the present invention. In this specification, the light-emitting device refers, generally, to the display panel having light-emitting elements formed on a substrate sealed between the substrate and a cover member, and the display module having an IC mounted on the display panel. Incidentally, the light emitting element has a layer including an organic compound that electroluminescence caused is obtained by applying an electric field (light-emitting layer), an anode and a cathode. Meanwhile, the electroluminescence in organic compound includes the light emission (fluorescent light) upon returning from the singlet-excited state to the ground state and the light emission (phosphorous light) upon returning from the triplet-excited state to the ground state, including any or both of light emission.

In this specification, all the layers that are provided between an anode and a cathode are defined as an organic light emitting layer. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layer layered in this order.

Figure 11:
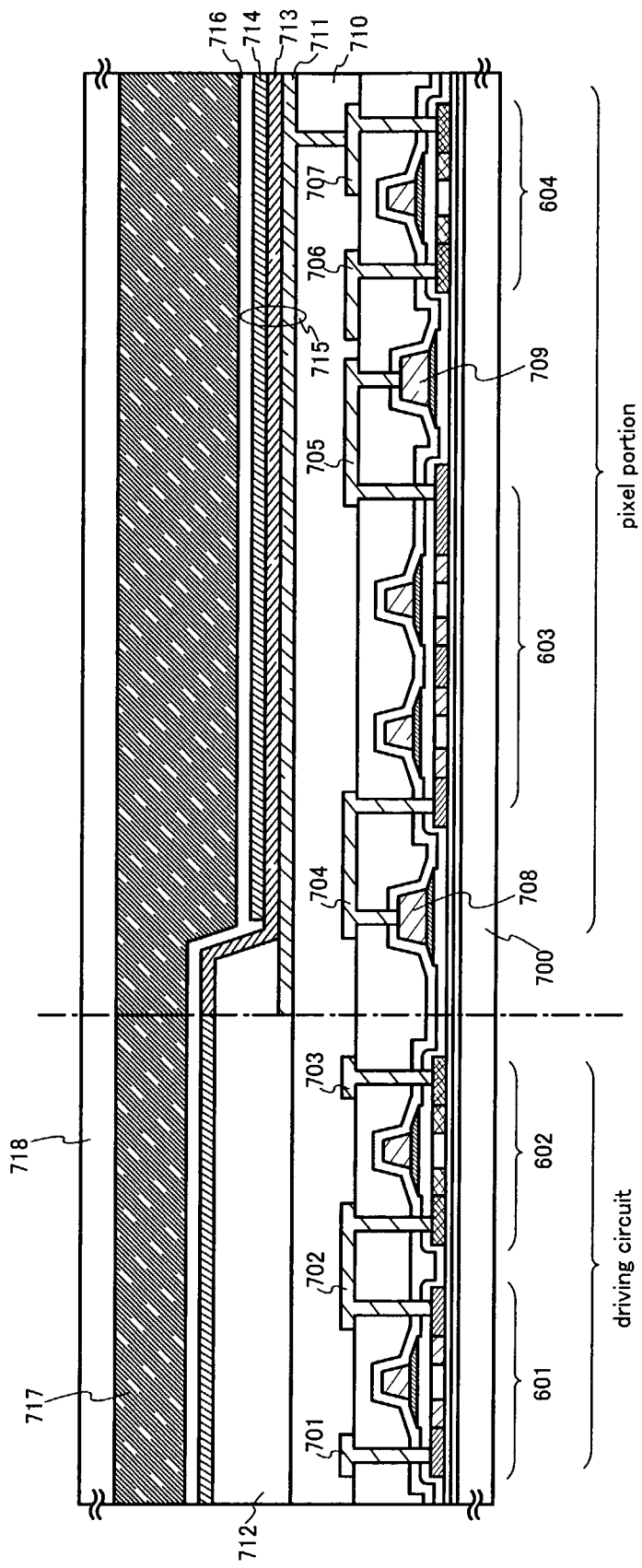
FIG. 11 is a sectional structural view of a driving circuit of a light emitting device and a pixel section.

FIG. 11 is a sectional view of a light-emitting device of this embodiment. In FIG. 11, the switching TFT 603 provided on the substrate 700 is formed by using the n-channel TFT 503 of FIG. 8. Consequently, concerning the explanation of the structure, it is satisfactory to refer the explanation on the n-channel TFT 503.

Incidentally, although this embodiment is of a double gate structure formed with two channel regions, it is possible to use a single gate structure formed with one channel region or a triple gate structure formed with three.

The driving circuit provided on the substrate 700 is formed by using the CMOS circuit of FIG. 8. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701 and 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 8. Consequently, concerning the explanation of the structure, it is satisfactory to refer to the explanation on the n-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a planarizing film 710 made of resin. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 11. The bank 712 may be formed by patterning an insulating film or organic resin film containing silicon with a thickness of 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light-emitting layer 713 is formed on the pixel electrode 711. Incidentally, although FIG. 11 shows only one pixel, this embodiment separately forms light-emitting layers correspondingly to the respective colors of R (red), G (green) and B (blue). Meanwhile, in this embodiment is formed a low molecular weight organic electroluminescent material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic electroluminescent material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic electroluminescent material is used for a light-emitting layer, it is possible to use an intermediate molecular weight organic electroluminescent material or a high molecular weight organic electroluminescent material. In addition, an aggregate of an organic compound which does not have subliming property, or an aggregate which has molecularity of 20 or less, or organic electroluminescent material which has a molecular chain length of 10 μM or less is a intermediate molecular weight organic electroluminescent material in this specification. As an example of using a high molecular weight organic electroluminescent material, it can be a lamination structure having a polythiophene (PEDOT) film provided in a thickness of 20 nm as a hole injection layer by spin coating method and a paraphenylene vinylene (PPV) film provided thereon in a thickness of approximately 100 nm as a light-emitting layer. Incidentally, if conjugate polymer materials of PPV are used, the wavelength of emitted light from red color to blue color can be selected respectively. Meanwhile, it is possible to use an inorganic material such as silicon carbide for an electron transporting layer or charge injecting layer. These organic electroluminescent materials or inorganic materials can be a known material.

Next, a cathode 714 of a conductive film is provided on the light-emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light-emitting layer 713 low in heat resistance. Meanwhile, the DLC film, having a high blocking effect to oxygen, can suppress the light-emitting layer 713 from oxidizing. Consequently, prevented is the problem of oxidation in the light-emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 11. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, p-channel TFTs 602, a switching TFT (n-channel TFT) 603 and a current control TFT (p-channel TFT) 604 on the substrate 700.

Furthermore, as was explained using FIG. 11, by providing an impurity region overlapped with the gate electrode through an insulating film, it is possible to form an n-channel TFT resistive to the deterioration resulting from hot-carrier effect. Consequently, a reliable light-emitting device can be realized.

Meanwhile, this embodiment shows only the configuration of the pixel portion and driving circuit. However, according to the manufacturing process in the embodiment, besides these, it is possible to form on the same insulating member such logic circuits as a signal division circuit, a D/A converter, an operation amplifier, a γ-correction circuit or the like. Furthermore, a memory or microprocessor can be formed.

Furthermore, explained is a light-emitting device of the embodiment having done the process up to sealing (or encapsulation) for protecting the light-emitting elements, using FIG. 12. Incidentally, the reference numerals used in FIG. 11 are cited as required.

FIG. 12A is a top view showing a state done up to sealing of the light-emitting elements while FIG. 12B is a sectional view taken on line C-C' in FIG. 12A. Reference numeral 801 designated by the dotted line is a source driving circuit, 806 a pixel portion and 807 a gate driving circuit. In addition, reference numeral 901 is a cover member, reference numeral 902 is a first seal member and reference numeral 903 is a second seal member. An encapsulation material 907 is provided at the inside surrounded by the seal member 902.

Incidentally, reference numeral 904 is a wiring to transmit a signal to be inputted to a source driving circuit 801 and gate driving circuit 807, to receive a video signal or clock signal from an FPC (Flexible Print Circuit) 905 as an external input terminal. Incidentally, although only FPC is shown herein, the FPC may be attached with a printed wiring board (PWB). The light-emitting device in the description includes not only a light-emitting device main body but also such a device in the state attached with an FPC or PWB.

Next, explanation is made on the sectional structure, by using FIG. 12B. The pixel portion 806 and the gate driving circuit 807 are formed on the substrate 700. The pixel portion 806 is formed with a plurality of pixels each including a current control TFT 604 and a pixel electrode 711 electrically connected to a drain thereof. Meanwhile, the gate driving circuit 807 is formed using a CMOS circuit having a combination of an n-channel TFT 601 and a p-channel TFT 602 (see FIG. 14).

The pixel electrode 711 serves as an anode of a light-emitting element. Meanwhile, banks 712 are formed on the both ends of the pixel electrode 711. On the pixel electrode 711, a light-emitting layer 713 and a cathode 714 of a light-emitting element are formed.

The cathode 714 serves also as a wiring common to all the pixels and electrically connected to the FPC 905 by way of a connection wiring 904. Furthermore, all the elements included in the pixel portion 806 and gate driving circuit 807 are covered by the passivation film 716.

Meanwhile, a cover member 901 is bonded by the first seal member 902. Incidentally, a resin-film spacer may be provided in order to secure spacing between the cover member 901 and the light-emitting elements. An encapsulation material 717 is filled inside the first seal member 902. Incidentally, the first seal member 902 and encapsulation material 717 preferably uses epoxy resin. Meanwhile, the first seal member 902 is preferably of a material to transmit water and oxygen to a possible less extent. Furthermore, the encapsulation material 717 may contain a substance having a hygroscopic effect or an antioxidant effect.

The encapsulation material 717 covering the light-emitting elements serves also as an adhesive to bond the cover member 901. Meanwhile, in this embodiment, as a material for the plastic substrate 901a forming the cover member 901 can be used, FRP (Fiberglass-Reinforced Plastics), PVF (polyvinyl Fluoride), Myler, polyester or acryl.

Meanwhile, after bonding the cover member 901 by using an encapsulation material 717, a second seal member 903 is provided so as to cover the side surface (exposed surface) of the encapsulation material 717. For the second seal member 903 can be used the same material as the first seal member 902.

With the above structure, by encapsulating the light-emitting elements in the encapsulation material 717, the light-emitting elements can be completely shielded from the outside. It is possible to prevent the intrusion, from the external, of the substance, such as water or oxygen, which accelerates the deterioration in the light-emitting layer. Thus, a reliable light-emitting device can be obtained.

The light-emitting device manufactured as mentioned above is fabricated by using a semiconductor film having a crystal grain of a large grain size. Therefore, it is possible to obtain enough operational characteristic and good reliability. The liquid crystal display device manufactured as above can be used as a display portion for an electronic appliance in various kinds.

Incidentally, this embodiment can be freely combined with the embodiments 1 to 4.

Embodiment 7

The present invention can be used in various electro-optical devices (active matrix type liquid crystal display device, active matrix type light-emitting device, active matrix type EC display device). That is, the present invention can be implemented in all of electronic equipments integrated with the electro-optical display device at display portions thereof.

As such electronic equipment, there are pointed out a video camera, a digital camera, a projector, a head mount display (goggle type display), a car navigation system, a car stereo, a personal computer, a portable information terminal (mobile computer, cellular phone, electronic book or the like) and the like. Examples of these are shown in FIGS. 13A to 13F, 14A to 14D, and 15A to 15C.

Figure 13A:
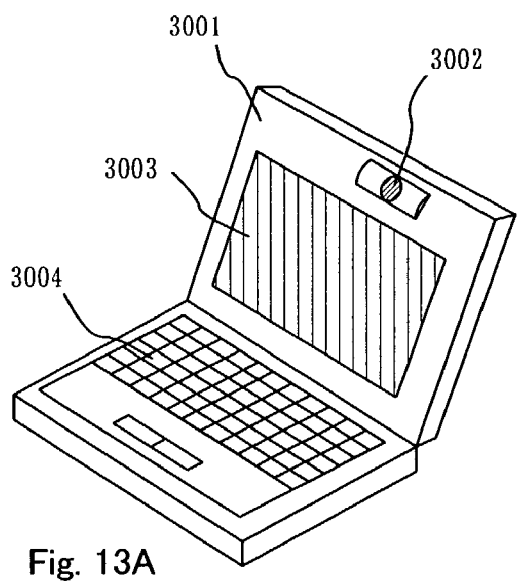
FIGS. 13A to 13F are views showing an example of a semiconductor device.

FIG. 13A shows a personal computer including a main body 3001, an image input portion 3002, a display portion 3003, a keyboard 3004 and the like. The present invention can be applied to the display portion 3003.

Figure 13B:
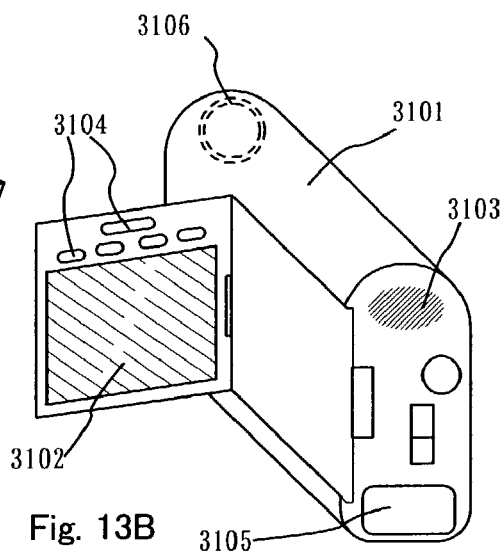

FIG. 13B shows a video camera including a main body 3101, a display portion 3102, a voice input portion 3103, operation switches 3104, a battery 3105, an image receiving portion 3106 and the like. The present invention can be applied to the display portion 3102.

Figure 13C:
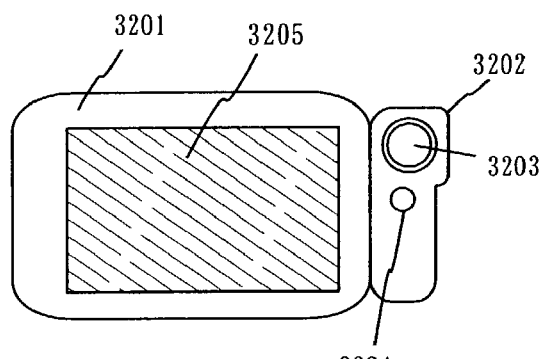

FIG. 13C shows a mobile computer including a main body 3201, a camera portion 3202, an image receiving portion 3203, an operation s witch 3204, a display portion 3205 and the like. The present invention can be applied to the display portion 3205.

Figure 13D:
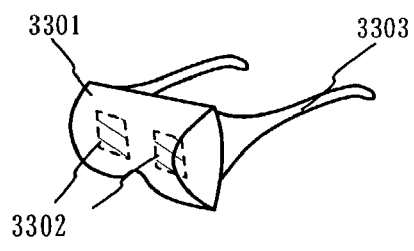

FIG. 13D shows a goggle type display including a main body 3301, a display portion 3302, an arm portion 3303 and the like. The present invention can be applied to the display portion 3302.

Figure 13E:
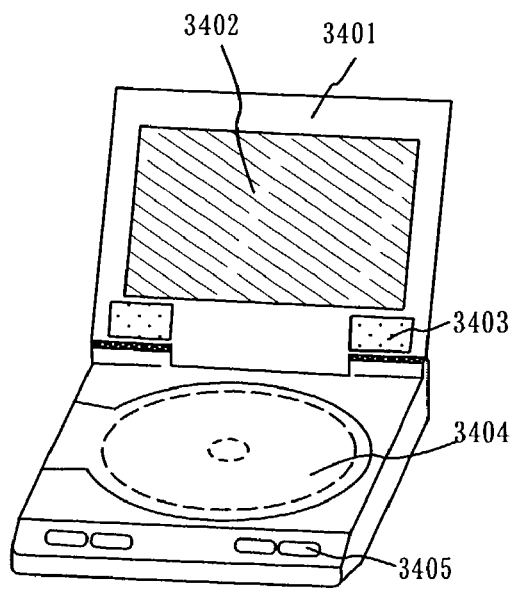

FIG. 13E shows a player using a record medium recorded with programs (hereinafter, referred to as record medium) including a main body 3401, a display portion 3402, a speaker portion 3403, a record medium 3404, an operation sw itch 3405 and the like. The player uses DVD (digital Versatile Disc), CD or the like as the record medium and can enjoy music, enjoy movie and carry out game or Internet. The present invention can be applied to the display portion 3402.

Figure 13F:
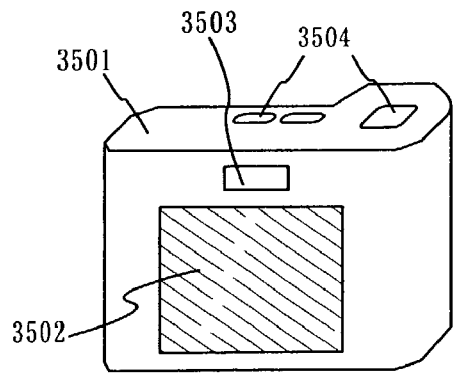

FIG. 13F shows a digital camera including a main body 3501, a display portion 3502, an eye contact portion 3503, operation switches 3504, an image receiving portion (not illustrated) and the like. The present invention can be applied to the display portion 3502.

Figure 14A:
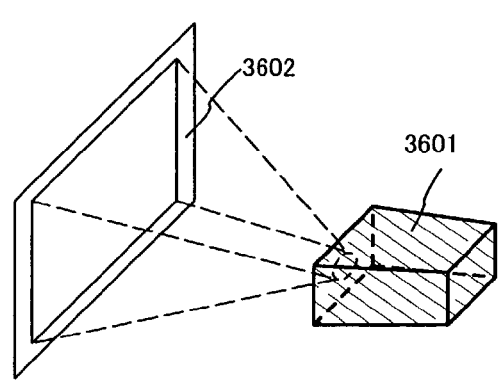
FIGS. 14A to 14D are views showing an example of the semiconductor device.

FIG. 14A shows a front type projector including projection equipment 3601, a screen 3602 and the like. The present invention can be applied to the liquid crystal display device and another circuit forming a part of the projection equipment 3601.

Figure 14B:
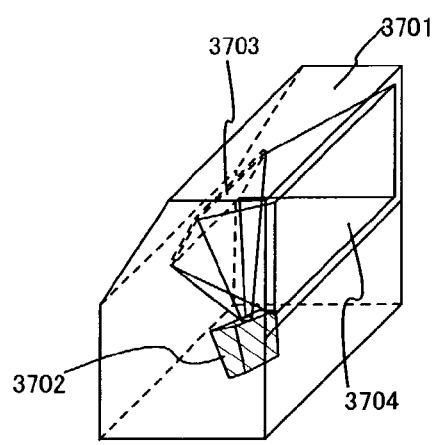

FIG. 14B shows a rear type projector including a main body 3701, projection equipment 3702, a mirror 3703, a screen 3704 and the like. The present invention can be applied to the liquid crystal display device and another circuit forming a part of the projection equipment 3702.

Figure 14C:
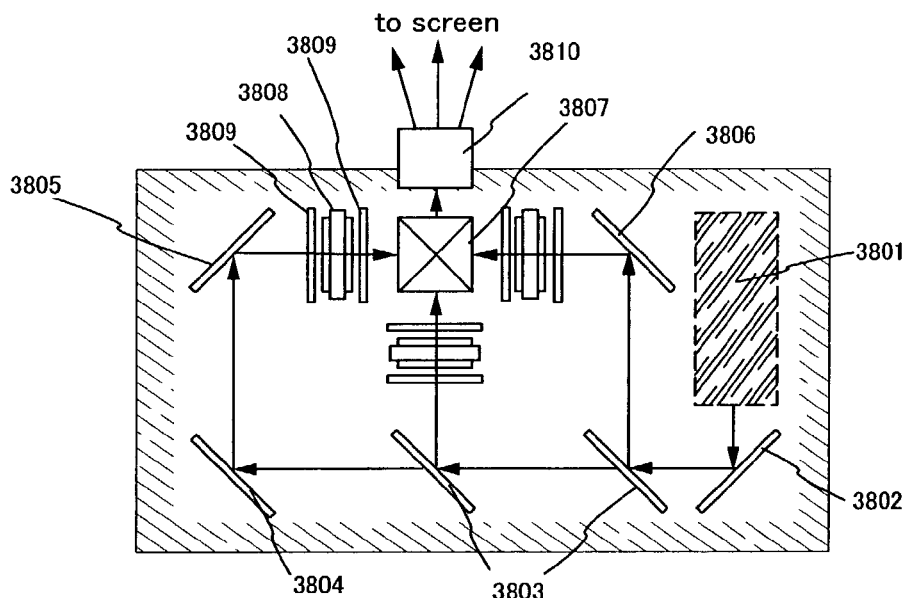

Further, FIG. 14C is a view showing an example of a structure of the projection equipment 3601 and 3702 in FIG. 14A and FIG. 14B. The projection equipment 3601 or 3702 is constituted by a light source optical system 3801, mirrors 3802, and 3804 through 3806, a dichroic mirror 3803, a prism 3807, a liquid crystal display device 3808, a phase difference plate 3809 and a projection optical system 3810. The projection optical system 3810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 14C.

Figure 14D:
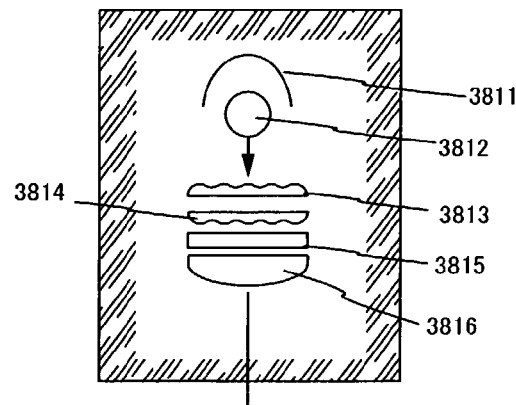

Further, FIG. 14D is a view showing an example of a structure of the light source optical system 3801 in FIG. 14C. According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 14D is only an example and this example is not particularly limited thereto. For example, a person of executing this embodiment may pertinently provide an optical system such as an optical lens, a film having a polarization function, a film for adjusting a phase difference or an IR film in the light source optical system.

However, according to the projectors shown in FIG. 14, there is shown a case of using a transmission type electro-optical device and an example of applying a reflection type electro-optical device and a light-emitting device are not illustrated.

Figure 15A:
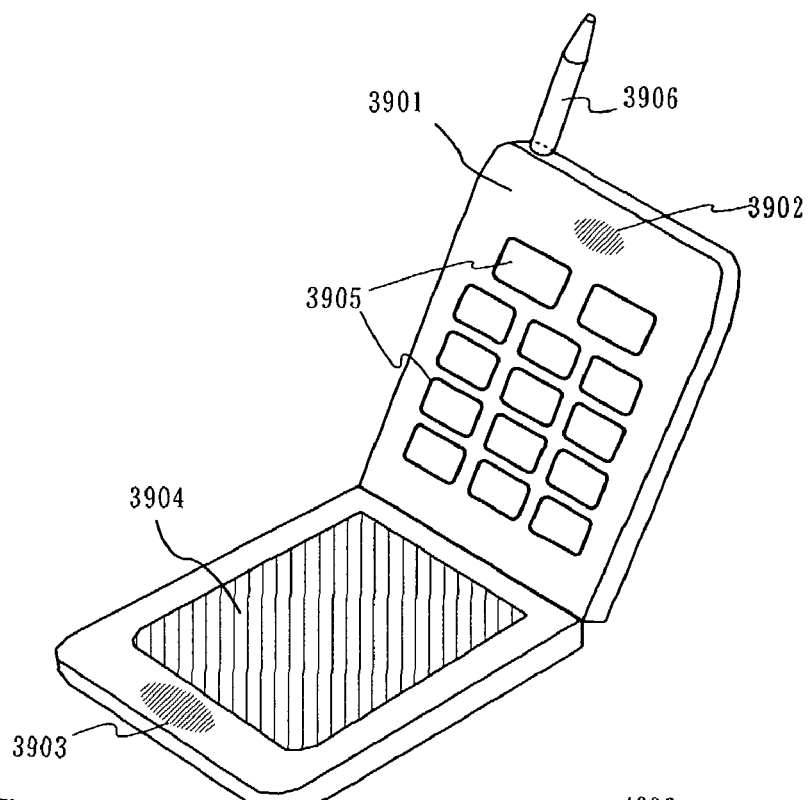
FIGS. 15A to 15C are views showing an example of the semiconductor device.

FIG. 15A shows a cellular phone including a main body 3901, a sound output portion 3902, an audio input portion 3903, a display portion 3904, operation switches 3905, an antenna 3906 and the like. The present invention can be applied to display portion 3904.

Figure 15B:
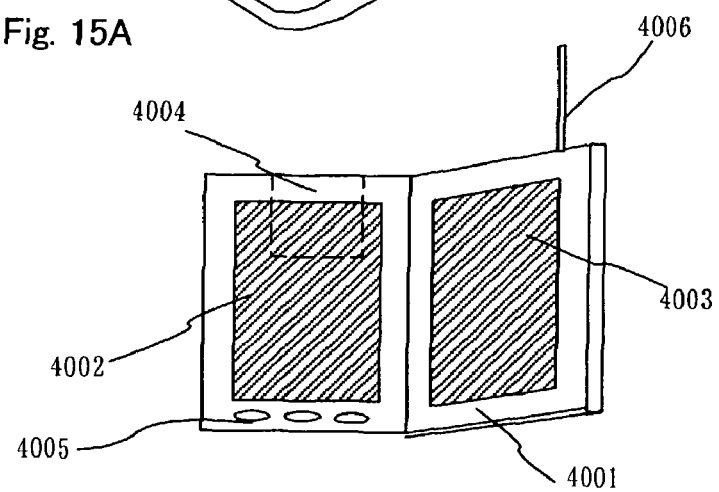

FIG. 15B shows a portable book (electronic book) including a main body 4001, display portions 4002 and 4003, a record medium 4004, an operation switch 4005, an antenna 4006 and the like. The present invention can be applied to display portions 4002 and 4003.

Figure 15C:
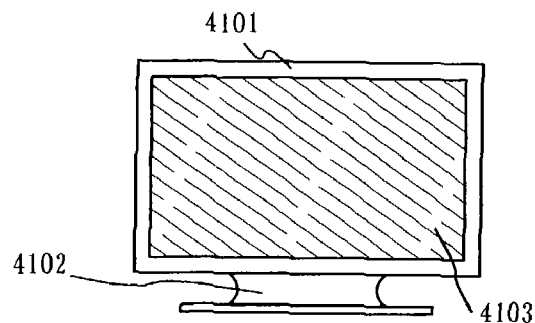

FIG. 15C shows a display including a main body 4101, a support base 4102, a display portion 4103 and the like. The present invention can be applied to display portion 4103. The display according to the present invention is advantageous particularly in the case of large screen formation and is advantageous in the display having a diagonal length of 10 inch or more (particularly, 30 inch or more).

As has been described, the range of applying the present invention is extremely wide and is applicable to electronic equipment of all the fields. The electronic equipment of the present invention can be implemented by freely combined with the structures in Embodiments 1 to 5.

Embodiment 8

In this embodiment, a method for reflecting the laser beam irradiated to the substrate by a reflecting plate and again irradiating the laser beam to the substrate will be explained by using FIG. 20.

Figure 20:
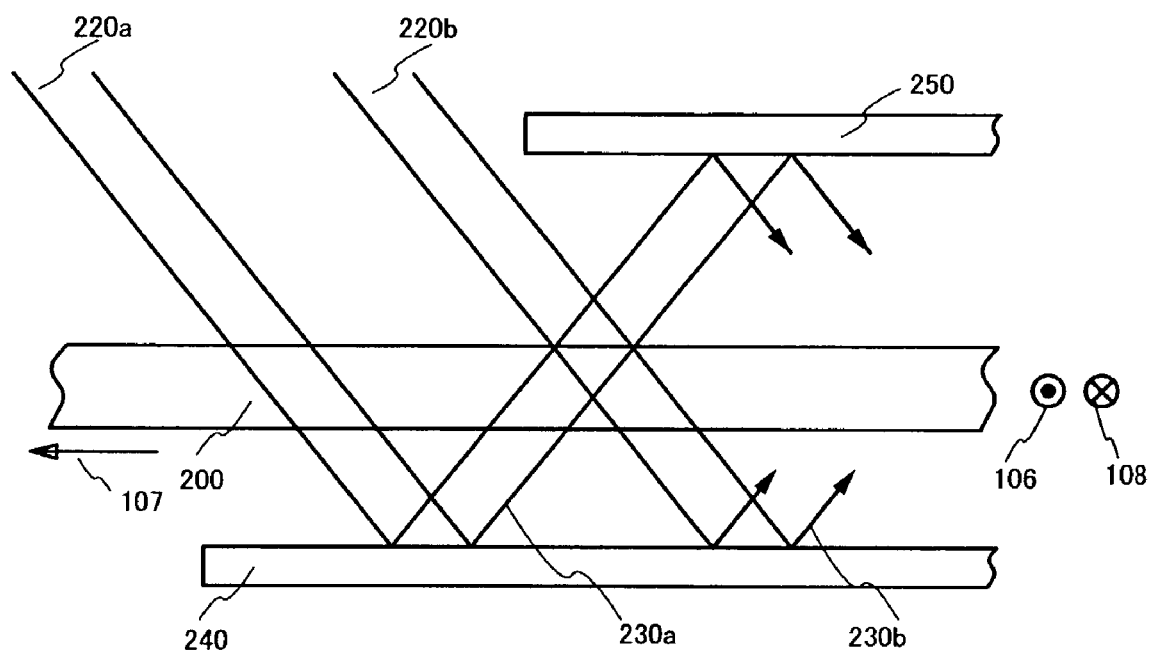
FIG. 20 is a view showing an example of the construction of the laser irradiating device.

In FIG. 20, a substrate 200, laser beams 220a, 220b, reflected lights 230a, 230b, a first reflecting plate 240 and a second reflecting plate 250 are shown. Further, reference numerals 106, 107 and 108 designate moving directions of the substrate.

The laser beam 220a is incident to the substrate and is then transmitted through the substrate and is reflected on the first reflecting plate 240 and is again incident to the substrate. This laser beam is described as reflected light 230a. The reflected light 230a is reflected by the second reflecting plate in a substrate direction. Similarly, the laser beam 220b is incident to the substrate and is then transmitted through the substrate, and is reflected by the first reflecting plate 240 in the substrate direction. This laser beam is described as reflected light 230b. The laser beam is suitably processed by the cylindrical lens, the isolator, etc. as in the embodiments 1 to 3. Similar to the embodiment 1, the substrate is moved and the laser beam can be irradiated to the entire substrate face.

Thus, if the plural laser beams are irradiated to the substrate by using the reflecting plates, the reflected lights of the laser beams can be also effectively utilized. Therefore, throughput is improved and the laser beams can be efficiently irradiated. Further, in the construction of this embodiment, interference can be also prevented by using plural laser light sources. However, when no laser beams are overlapped in the irradiated substrate, the same laser light source may be also used.

In this embodiment, the reflecting plate is arranged in parallel with the substrate, but may be also slantingly arranged with respect to the substrate.

This embodiment can be used in embodiments 1 to 7. However, when the laser beam oscillated from one laser light source is divided and used as plural laser beams, it is necessary that the distance from the substrate to the reflecting plate is equal to or greater than the half of a coherence length of the laser beam to prevent interference. However, when no laser beams are overlapped in the irradiated substrate, the same laser light source may be also used.

Embodiment 9

In this embodiment, a method for reflecting the laser beam irradiated to the substrate by the reflecting plate and again irradiating the laser beam to the substrate will be explained by using FIG. 21.

Figure 21:
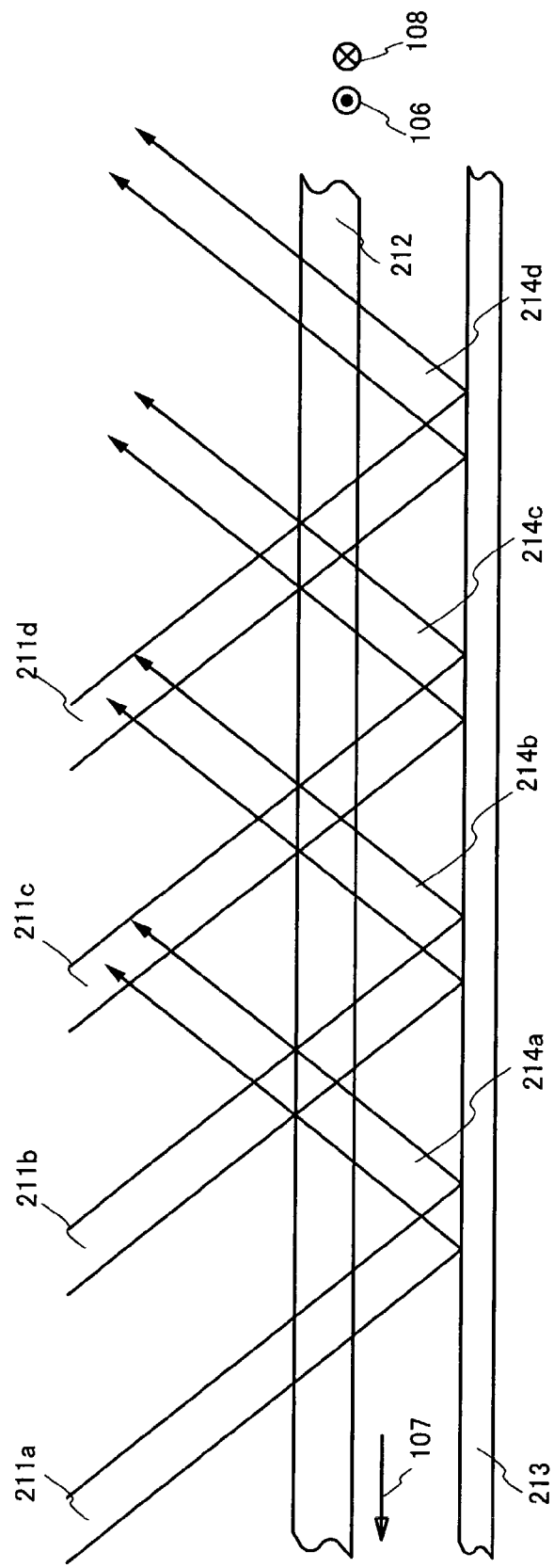
FIG. 21 is a view showing an example of the construction of the laser irradiating device.

In FIG. 21, a substrate 212, laser beams 211a, 211b, 211c, 211d, reflected lights 214a, 214b, 214c, 214d and a reflecting plate 213 are shown. Reference numerals 106, 107 and 108 designate moving directions of the substrate.

The laser beam 211a is incident to the substrate and is then transmitted through the substrate, and is reflected on the reflecting plate 213 and is again incident to the substrate. This laser beam is described as reflected light 214a. The laser beam 211b is incident to the substrate and is then transmitted through the substrate, and is reflected on the reflecting plate 213 and is again incident to the substrate. This laser beam is described as reflected light 214b. The laser beam 211c is incident to the substrate and is then transmitted through the substrate, and is reflected on the reflecting plate 213 and is again incident to the substrate. This laser beam is described as reflected light 214c. The laser beam 211d is incident to the substrate and is then transmitted through the substrate, and is reflected on the reflecting plate 213 and is again incident to the substrate. This laser beam is described as reflected light 214d. The laser beam is suitably processed by the cylindrical lens, the isolator, etc. as in the embodiments 1 to 3. Similar to the embodiment 1, the substrate is moved and the laser beam can be irradiated to the entire substrate face.

Thus, if the plural laser beams are irradiated to the substrate by using the reflecting plates, the reflected lights of the laser beams can be also effectively utilized. Therefore, throughput is improved and the laser beams can be efficiently irradiated. Further, in the construction of this embodiment, interference can be also prevented by to using plural laser light sources. However, when no laser beams are overlapped in the irradiated substrate, the same laser light source may be also used.

In this embodiment, the reflecting plate is arranged in parallel with the substrate, but may be also slantingly arranged with respect to the substrate.

This embodiment can be used in embodiments 1 to 7. However, when the laser beam oscillated from one laser light source is divided and used as plural laser beams, it is necessary that the distance from the substrate to the reflecting plate is equal to or greater than the half of a coherence length of the laser beam to prevent interference. However, when no laser beams are overlapped in the irradiated substrate, the same laser light source may be also used.

EFFECT OF THE INVENTION

The following basic meaningful properties can be obtained by adopting the construction of the present invention.

(a) It is a simple method conforming to the conventional manufacturing process of the TFT.

(b) It is possible to irradiate the laser beam having the same energy distribution on the irradiating face.

(c) Throughput can be improved. This is particularly effective in the case of the large area substrate.

(d) It is possible to form a semiconductor film having a crystal grain close to that of a monocrystal.

(e) In addition to satisfaction of the above advantages, in a semiconductor device represented by an active matrix type liquid crystal display device, the improvements of operating characteristics and reliability of the semiconductor device can be realized. Further, a reduction in manufacture cost of the semiconductor device can be realized.

What is claimed is:

1. A manufacturing method of a semiconductor device comprising:
  forming a semiconductor film over an insulating surface;
  forming a plurality of laser beams simultaneously by using optical systems, wherein the plurality of laser beams are elliptical laser beams or rectangular laser beams;
  irradiating the plurality of laser beams to at least a portion and another portion of the semiconductor film simultaneously while the semiconductor film is moved in a first direction;
  moving the semiconductor film in a second direction; and
  irradiating the plurality of laser beams to subsequent latter portions simultaneously while the semiconductor film is moved in a direction reverse to the first direction, wherein the plurality of laser beams are parallel to one another, wherein incident angles of the plurality of the laser beams with respect to an irradiating face of the semiconductor film are the same and fixed acute angles, wherein the plurality of laser beams are transmitted through the semiconductor film and reflected on a reflecting plate under the semiconductor film, and wherein the plurality of laser beams are incident to the semiconductor film again.

2. A manufacturing method of a semiconductor device according to claim 1, wherein the plurality of laser beams are oscillated from a solid laser of continuous oscillation or pulse oscillation.

3. A manufacturing method of a semiconductor device according to claim 1, wherein the laser beams are oscillated from one or plural kinds selected from a YAG laser, a $YVO_4$ laser, a YLF laser, a $YAlO_3$ laser, a glass laser, a ruby laser, an alexandrite laser and a Ti:sapphire laser of continuous oscillation or pulse oscillation.

4. A manufacturing method of a semiconductor device according to claim 1, wherein the laser beams are oscillated from one or plural kinds selected from an Ar laser and a Kr laser.

5. A manufacturing method of a semiconductor device according to claim 1, wherein a convex lens, a cylindrical lens, or a grating is used as the optical systems.

6. A manufacturing method of a semiconductor device according to claim 1, wherein the semiconductor device is incorporated into an electronic equipment selected from the group consisting of a personal computer, a video camera, a mobile computer, a goggle type display, a player, a digital camera, a front type projector, a rear type projector, a cellular phone, a portable book, and a display.

7. A manufacturing method of a semiconductor device comprising:

forming a semiconductor film over a substrate;

forming shapes of a plurality of laser beams at the semiconductor film slantingly arranged with respect to the plurality of laser beams in an elliptical shape or a rectangular shape by optical systems;

irradiating the plurality of laser beams while the semiconductor film is moved in a first direction wherein the plurality of laser beams are irradiated at an incident angle φ satisfying $$\phi \geq \arcsin(W/2d)$$

when widths of the plurality of laser beams are set to W and the thickness of the substrate is set to d;

moving the semiconductor film in a second direction; and irradiating the plurality of laser beams while the semiconductor film is moved in a direction reverse to the first direction, wherein incident angles of the plurality of laser beams with respect to an irradiating face of the semiconductor film are the same and fixed, wherein the plurality of laser beams are transmitted through the semiconductor film and reflected on a reflecting plate under the semiconductor film, and wherein the plurality of laser beams are incident to the semiconductor film again.

8. A manufacturing method of a semiconductor device according to claim 7, wherein the plurality of laser beams are oscillated from a solid laser of continuous oscillation or pulse oscillation.

9. A manufacturing method of a semiconductor device according to claim 7, wherein the plurality of laser beams are oscillated from one or plural kinds selected from a YAG laser, a $YVO_4$ laser, a YLF laser, a $YAlO_3$ laser, a glass laser, a ruby laser, an alexandrite laser and a Ti:sapphire laser of continuous oscillation or pulse oscillation.

10. A manufacturing method of a semiconductor device according to claim 7, wherein the plurality of laser beams are oscillated from one or plural kinds selected from an Ar laser and a Kr laser.

11. A manufacturing method of a semiconductor device according to claim 7, wherein a convex lens, a cylindrical lens, or a grating is used as the optical systems.

12. A manufacturing method of a semiconductor device according to claim 7, wherein the semiconductor device is incorporated into an electronic equipment selected from the group consisting of a personal computer, a video camera, a mobile computer, a goggle type display, a player, a digital camera, a front type projector, a rear type projector, a cellular phone, a portable book, and a display.

13. A manufacturing method of a semiconductor device comprising:

forming a semiconductor film over an insulating surface;

forming a plurality of laser beams simultaneously by using optical systems, wherein the plurality of laser beams are elliptical laser beams or rectangular laser beams;

irradiating the plurality of laser beams to at least a portion and another portion of the semiconductor film simultaneously while the semiconductor film is moved in a first direction;

after irradiating the plurality of laser beams while the semiconductor film is moved in the first direction, irradiating the plurality of laser beams to subsequent latter portions simultaneously while the semiconductor film is moved in a direction reverse to the first direction; and after irradiating the plurality of laser beams while the semiconductor film is moved in the direction reverse to the first direction, moving the semiconductor film in a second direction, wherein the plurality of laser beams are parallel to one another, wherein incident angles of the plurality of the laser beams with respect to an irradiating face of the semiconductor film are the same and fixed acute angles, wherein the plurality of laser beams are transmitted through the semiconductor film and reflected on a reflecting plate under the semiconductor film, and wherein the plurality of laser beams are incident to the semiconductor film again.

14. A manufacturing method of a semiconductor device according to claim 13, wherein the plurality of laser beams are oscillated from a solid laser of continuous oscillation or pulse oscillation.

15. A manufacturing method of a semiconductor device according to claim 13, wherein the laser beams are oscillated from one or plural kinds selected from a YAG laser, a $WO_4$ laser, a YLF laser, a $YAlO_3$ laser, a glass laser, a ruby laser, an alexandrite laser and a Ti:sapphire laser of continuous oscillation or pulse oscillation.

16. A manufacturing method of a semiconductor device according to claim 13, wherein the laser beams are oscillated from one or plural kinds selected from an Ar laser and a Kr laser.

17. A manufacturing method of a semiconductor device according to claim 13, wherein a convex lens or a cylindrical lens is used as the optical systems.

18. A manufacturing method of a semiconductor device according to claim 13, wherein the semiconductor device is incorporated into an electronic equipment selected from the group consisting of a personal computer, a video camera, a mobile computer, a goggle type display, a player, a digital camera, a front type projector, a rear type projector, a cellular phone, a portable book, and a display.

19. A manufacturing method of a semiconductor device comprising:

forming a semiconductor film over a substrate;

forming shapes of a plurality of laser beams at the semiconductor film slantingly arranged with respect to the plurality of laser beams in an elliptical shape or a rectangular shape by optical systems;

irradiating the plurality of laser beams while the semiconductor film is moved in a first direction wherein the plurality of laser beams are irradiated at an incident angle $\phi$ satisfying $\phi \geq \arcsin(W/2d)$ when widths of the plurality of laser beams are set to W and the thickness of the substrate is set to d;

after irradiating the plurality of laser beams while the semiconductor film is moved in the first direction, irradiating the plurality of laser beams at the incident angle $\phi$ while the semiconductor film is moved in a direction reverse to the first direction; and after irradiating the plurality of laser beams at the incident angle $\phi$ while the semiconductor film is moved in the direction reverse to the first direction, moving the semiconductor film in a second direction, wherein incident angles of the plurality of laser beams with respect to an irradiating face of the semiconductor film are the same and fixed wherein the plurality of laser beams are transmitted through the semiconductor film and reflected on a reflecting plate under the semiconductor film, and wherein the plurality of laser beams are incident to the semiconductor film again.

20. A manufacturing method of a semiconductor device according to claim 19, wherein the plurality of laser beams are oscillated from a solid laser of continuous oscillation or pulse oscillation.

21. A manufacturing method of a semiconductor device according to claim 19, wherein the plurality of laser beams are oscillated from one or plural kinds selected from a YAG laser, a $YVO_4$ laser, a YLF laser, a $YAlO_3$ laser, a glass laser, a ruby laser, an alexandrite laser and a Ti:sapphire laser of continuous oscillation or pulse oscillation.

22. A manufacturing method of a semiconductor device according to claim 19, wherein the plurality of laser beams are oscillated from one or plural kinds selected from an Ar laser and a Kr laser.

23. A manufacturing method of a semiconductor device according to claim 19, wherein a convex lens or a cylindrical lens is used as the optical systems.

24. A manufacturing method of a semiconductor device according to claim 19, wherein the semiconductor device is incorporated into an electronic equipment selected from the group consisting of a personal computer, a video camera, a mobile computer, a goggle type display, a player, a digital camera, a front type projector, a rear type projector, a cellular phone, a portable book, and a display.

* * * * *